(12) United States Patent
Giuliano

(10) Patent No.: US 11,183,490 B2
(45) Date of Patent: Nov. 23, 2021

(54) MULTI-LAYER POWER CONVERTER WITH DEVICES HAVING REDUCED LATERAL CURRENT

(71) Applicant: pSemi Corporation, San Diego, CA (US)

(72) Inventor: David Giuliano, Bedford, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/558,679

(22) Filed: Sep. 3, 2019

(65) Prior Publication Data

US 2020/0243495 A1 Jul. 30, 2020

Related U.S. Application Data

(60) Continuation of application No. 16/139,583, filed on Sep. 24, 2018, now Pat. No. 10,424,564, which is a
(Continued)

(51) Int. Cl.
*H01L 25/16* (2006.01)
*H01L 23/64* (2006.01)
(Continued)

(52) U.S. Cl.
CPC ........... *H01L 25/16* (2013.01); *H01L 23/481* (2013.01); *H01L 23/5223* (2013.01);
(Continued)

(58) Field of Classification Search
CPC ... H01L 23/5223; H01L 28/40; H01L 23/642; H01L 23/5227; H01L 23/64; H01L 25/16;
(Continued)

(56) References Cited

U.S. PATENT DOCUMENTS

| 4,214,174 A | 7/1980 | Dickson |
| 5,301,097 A | 4/1994 | McDaniel |

(Continued)

FOREIGN PATENT DOCUMENTS

| CN | 103975433 B | 8/2014 |
| DE | 112012004377 T5 | 7/2014 |

(Continued)

OTHER PUBLICATIONS

U.S. Appl. No. 13/654,113, Filing Receipt dated Nov. 9, 2012, 4 pages Doc 9001.

(Continued)

*Primary Examiner* — John P. Dulka
(74) *Attorney, Agent, or Firm* — Finnegan, Henderson, Farabow, Garrett & Dunner, LLP

(57) ABSTRACT

Various embodiments of energy storage elements for use in power converters are described. In one example embodiment, briefly, an integrated circuit (IC) for use with a power converter may comprise a first layer comprising a first set of devices disposed on a device face thereof; a second layer comprising a second set of devices disposed on a device face thereof; a first interconnect structure to be disposed between the first layer and an electrical interface, the first interconnect structure to electrically couple the first set of devices to one or more thru vias; and a second interconnect structure to be disposed between the first layer and the second layer, the second interconnect structure to electrically couple the second set of devices to the one or more thru vias. Likewise, in some instances, one or more thru vias may extend through at least one of the following: the first layer; the second layer; or any combination thereof.

20 Claims, 17 Drawing Sheets

Related U.S. Application Data continuation of application No. 15/277,056, filed on Sep. 27, 2016, now Pat. No. 10,083,947, which is a continuation of application No. 14/294,642, filed on Jun. 3, 2014, now Pat. No. 9,497,854, which is a division of application No. 13/654,113, filed on Oct. 17, 2012, now Pat. No. 8,743,553.

(60) Provisional application No. 61/548,360, filed on Oct. 18, 2011.

(51) Int. Cl.
| | |
|---|---|
| H02M 3/07 | (2006.01) |
| H01L 27/01 | (2006.01) |
| H01L 27/06 | (2006.01) |
| H01L 49/02 | (2006.01) |
| H01L 23/48 | (2006.01) |
| H01L 23/522 | (2006.01) |
| H05K 1/02 | (2006.01) |
| H05K 1/11 | (2006.01) |
| H01L 27/16 | (2006.01) |

(52) U.S. Cl.
CPC .......... *H01L 23/5227* (2013.01); *H01L 23/64* (2013.01); *H01L 23/642* (2013.01); *H01L 27/016* (2013.01); *H01L 27/0688* (2013.01); *H01L 27/16* (2013.01); *H01L 28/40* (2013.01); *H01L 28/90* (2013.01); *H02M 3/07* (2013.01); *H05K 1/0298* (2013.01); *H05K 1/115* (2013.01); *H01L 2224/0401* (2013.01); *H01L 2224/0554* (2013.01); *H01L 2224/0557* (2013.01); *H01L 2224/05572* (2013.01); *H01L 2224/16225* (2013.01); *H01L 2224/16265* (2013.01); *H01L 2924/19103* (2013.01); *H01L 2924/19104* (2013.01); *H01L 2924/19105* (2013.01); *H02M 3/077* (2021.05)

(58) Field of Classification Search
CPC ....... H01L 27/16; H01L 23/481; H01L 28/90; H01L 27/0688; H01L 2224/0557; H01L 2924/19104; H01L 27/016; H02M 3/07; H05K 1/0298; H05K 1/115
See application file for complete search history.

(56) References Cited

U.S. PATENT DOCUMENTS

| | | | |
|---|---|---|---|
| 5,737,201 | A | 4/1998 | Meynard et al. |
| 7,190,210 | B2 | 3/2007 | Azrai et al. |
| 7,224,062 | B2 | 5/2007 | Hsu |
| 7,239,194 | B2 | 7/2007 | Azrai et al. |
| 7,807,499 | B2 | 10/2010 | Nishizawa |
| 8,048,766 | B2 | 11/2011 | Joly et al. |
| 8,193,604 | B2 | 6/2012 | Lin et al. |
| 8,212,541 | B2 | 7/2012 | Perrault et al. |
| 8,395,914 | B2 | 3/2013 | Klootwijk et al. |
| 8,743,553 | B2 | 6/2014 | Giuliano |
| 9,350,234 | B2 | 5/2016 | Verma |
| 9,497,854 | B2 | 11/2016 | Giuliano |
| 10,083,947 | B2 | 9/2018 | Giuliano |
| 10,424,564 | B2 * | 9/2019 | Giuliano ............... H01L 23/481 |
| 2002/0060914 | A1 | 5/2002 | Porter et al. |
| 2005/0207133 | A1 | 9/2005 | Pavier et al. |
| 2006/0153495 | A1 | 7/2006 | Wynne |
| 2007/0230221 | A1 | 10/2007 | Lim et al. |
| 2009/0257211 | A1 | 10/2009 | Kontani et al. |
| 2010/0140736 | A1 | 6/2010 | Lin et al. |
| 2010/0202161 | A1 | 8/2010 | Sims et al. |
| 2010/0214746 | A1 | 8/2010 | Lotfi et al. |
| 2010/0244189 | A1 | 9/2010 | Klootwijk et al. |
| 2010/0244585 | A1 | 9/2010 | Tan et al. |
| 2010/0276572 | A1 * | 11/2010 | Iwabuchi ............... H01L 25/18 250/208.1 |
| 2011/0163414 | A1 | 7/2011 | Lin et al. |
| 2011/0204724 | A1 | 8/2011 | Verma |
| 2011/0216561 | A1 * | 9/2011 | Bayerer ............... H01L 25/162 363/71 |
| 2012/0146177 | A1 | 6/2012 | Choi et al. |
| 2013/0049714 | A1 | 2/2013 | Chiu |
| 2013/0147543 | A1 | 6/2013 | Dai |
| 2013/0234785 | A1 | 9/2013 | Dai |
| 2016/0111468 | A1 * | 4/2016 | Qian ................. H01L 27/14687 438/80 |

FOREIGN PATENT DOCUMENTS

| | | |
|---|---|---|
| GB | 2509652 A | 7/2014 |
| JP | 10327573 | 12/1998 |
| JP | 11235053 | 8/1999 |
| WO | 2006/093600 | 9/2006 |
| WO | 2012/151466 | 11/2012 |
| WO | 20130059446 A1 | 4/2013 |

OTHER PUBLICATIONS

U.S. Appl. No. 13/654,113, Filing Receipt dated Nov. 16, 2012, 3 pages Doc 9002.
U.S. Appl. No. 13/654,113, Decision Granting Request for Prioritized Examination dated Nov. 28, 2012, 1 page Doc 9003.
U.S. Appl. No. 13/654,113, Restriction Requirement dated Mar. 29, 2013, 7 pages Doc 9004.
U.S. Appl. No. 13/654,113, Response to Restriction Requirement dated Apr. 3, 2013, 3 pages Doc 9005.
U.S. Appl. No. 13/654,113, Notice of Publication dated Apr. 18, 2013, 1 page Doc 9006.
U.S. Appl. No. 13/654,113, Request for Corrected Filing Receipt dated Apr. 25, 2013, 9 pages Doc 9007.
U.S. Appl. No. 13/654,113, Replacement Filing Receipt and Ntc of Acceptance of POA dated May 8, 2013, 4 pages Doc 9008.
U.S. Appl. No. 13/654,113, Non-Final Office Action dated Jun. 24, 2013, 24 pages Doc 9009.
U.S. Appl. No. 13/654,113, Response to Non-Final Office Action dated Sep. 18, 2013, 70 pages Doc 9010.
U.S. Appl. No. 13/654,113, Final Office Action dated Oct. 28, 2013, 32 pages Doc 9011.
U.S. Appl. No. 13/654,113, Response to Final Office Action dated Jan. 31, 2014, 13 pages Doc 9012.
U.S. Appl. No. 13/654,113, Notice of Appeal dated Feb. 28, 2014, 11 pages Doc 9013.
U.S. Appl. No. 13/654,113, Notice of Allowance dated Mar. 7, 2014, 32 pages Doc 9014.
U.S. Appl. No. 13/654,113, Issue Fee Payment dated Apr. 24, 2014, 6 pages Doc 9015.
U.S. Appl. No. 13/654,113, Issue Notification dated May 14, 2014, 1 page Doc 9016.
U.S. Appl. No. 13/654,113, Notification of Loss of Entitlement to Small Entity Status under 37 CFR 1 27(g)(2) dated Mar. 5, 2017, 1 page Doc 9017.
U.S. Appl. No. 13/654,113, Acknowledgment of Loss of Entitlement to Small Entity Status Discount dated Jun. 9, 2017, 1 page Doc 9018.
U.S. Appl. No. 14/294,642, Notice to File Missing Parts and Filing Receipt dated Jun. 13, 2014, 6 pages Doc 9019.
U.S. Appl. No. 14/294,642, Response to Notice to File Missing Parts dated Aug. 13, 2014, 6 pages Doc 9020.
U.S. Appl. No. 14/294,642, Updated Filing Receipt dated Aug. 19, 2014, 4 pages Doc 9021.
U.S. Appl. No. 14/294,642, Decision on Request to Participate in the Patent Prosecution Highway Program and Petition to Make Special under 37 CFR 1 102(a), dated Aug. 25, 2014, 2 pages Doc 9022.
U.S. Appl. No. 14/294,642, Restriction Requirement dated Sep. 25, 2014, 7 pages Doc 9023.

(56) References Cited

OTHER PUBLICATIONS

U.S. Appl. No. 14/294,642, Notice of Publication dated Oct. 8, 2014, 1 page Doc 9024.
U.S. Appl. No. 14/294,642, Response to Restriction Requirement dated Oct. 24, 2014, 3 pages Doc 9025.
U.S. Appl. No. 14/294,642, Non-Final Office Action dated Nov. 20, 2014, 10 pages Doc 9026.
U.S. Appl. No. 14/294,642, Response to Non-Final Office Action dated Feb. 20, 2015, 15 pages Doc 9027.
U.S. Appl. No. 14/294,642, Final Office Action dated Mar. 19, 2015, 11 pages Doc 9028.
U.S. Appl. No. 14/294,642, Response to Final Office Action dated May 19, 2015, 34 pages Doc 9029.
U.S. Appl. No. 14/294,642, Advisory Action dated Jun. 9, 2015, 4 pages Doc 9030.
U.S. Appl. No. 14/294,642, Notice of Appeal dated Jun. 17, 2015, 11 pages Doc 9031.
U.S. Appl. No. 14/294,642, Notice of Panel Decision dated Jun. 4, 2015, 2 pages Doc 9032.
U.S. Appl. No. 14/294,642, Non-Final Office Action dated Aug. 25, 2015, 18 pages Doc 9033.
U.S. Appl. No. 14/294,642, Response to Office Action dated Nov. 25, 2015, 44 pages Doc 9034.
U.S. Appl. No. 14/294,642, Final Office Action dated Jan. 11, 2016, 46 pages Doc 9035.
U.S. Appl. No. 14/294,642, Notice of Appeal dated Apr. 11, 2016, 9 pages Doc 9036.
U.S. Appl. No. 14/294,642, Petition for Review dated Apr. 18, 2016, 8 pages Doc 9037.
U.S. Appl. No. 14/294,642, Notice of Panel decision dated May 31, 2016, 2 pages Doc 9038.
U.S. Appl. No. 14/294,642, Final Office Action dated Mar. 19, 2015, 11 pages Doc 9039.
U.S. Appl. No. 14/294,642, Notice of Allowance dated Jun. 27, 2016, 88 pages Doc 9040.
U.S. Appl. No. 14/294,642, Request for Corrected Filing Receipt dated Sep. 20, 2016, 34 pages Doc 9041.
U.S. Appl. No. 14/294,642, Corrected Filing Receipt dated Sep. 23, 2016, 3 pages Doc 9042.
U.S. Appl. No. 14/294,642, Issue Fee Payment dated Sep. 27, 2016, 17 pages Doc 9043.
U.S. Appl. No. 14/294,642, Rule 312 Amendment and Issue Fee payment dated Oct. 5, 2016, 7 pages Doc 9044.
U.S. Appl. No. 14/294,642, Issue Notification dated Oct. 26, 2016, 1 page Doc 9045.
U.S. Appl. No. 14/294,642, Acknowledgment of Loss of Entitlement to Entity Status Discount dated Jun. 9, 2017, 1 page Doc 9046.
U.S. Appl. No. 15/277,056, Filing Receipt and Notice to File Missing Parts dated Oct. 11, 2016, 6 pages, Doc 9047.
U.S. Appl. No. 15/277,056, Preliminary Amendment and response to Notice to File Missing Parts dated Mar. 13, 2017, 14 pages, Doc 9048.
U.S. Appl. No. 15/277,056, Updated Filing Receipt dated Mar. 15, 2017, 4 pages, Doc 9049.
U.S. Appl. No. 15/277,056, Notice of Publication dated Jun. 21, 2017, 1 page, Doc 9050.
U.S. Appl. No. 15/277,056, Request for Corrected Filing Receipt and Acknowledgment of Loss of Entitlement to Entity Status Discount dated Oct. 3, 2017, 17 pages, Doc 9051.
U.S. Appl. No. 15/277,056, Corrected Filing Receipt dated Oct. 5, 2017, 3 pages, Doc 9052.
U.S. Appl. No. 15/277,056, Non-Final Office Action dated Jan. 12, 2018, 60 pages, Doc 9053.
U.S. Appl. No. 15/277,056, Request for Updated Filing Receipt dated Feb. 23, 2018, 11 pages, Doc 9054.
U.S. Appl. No. 15/277,056, Corrected Filing Receipt dated Mar. 29, 2018, 3 pages, Doc 9055.
U.S. Appl. No. 15/277,056, Response to Non-Final Office Action dated Apr. 12, 2018, 13 pages, Doc 9056.
U.S. Appl. No. 15/277,056, Notice of Allowance dated Jun. 15, 2018, 65 pages, Doc 9057.
U.S. Appl. No. 15/277,056, Issue Fee Payment dated Aug. 21, 2018, 6 pages, Doc 9058.
U.S. Appl. No. 15/277,056, Issue Notification dated Sep. 5, 2018, 1 page, Doc 9059.
U.S. Appl. No. 16/139,583 Filing Receipt dated Sep. 24, 2018, 1 page, Doc 9060.
U.S. Appl. No. 16/139,583 Non-Final Office Action dated Nov. 16, 2018, 121 page, Doc 9061.
U.S. Appl. No. 16/139,583 Response to Non-Final Office Action dated Jan. 11, 2019, 11 pages, Doc 9062.
U.S. Appl. No. 16/139,583 Notice of Publication dated Jan. 24, 2019, 1 page, Doc 9063.
U.S. Appl. No. 16/139,583 Notice of Allowance dated Mar. 5, 2019, 128 pages, Doc 9064.
U.S. Appl. No. 16/139,583 Rule 312 Amendment and Issue Fee Payment dated Jul. 26, 2015, 15 pages, Doc 9065.
U.S. Appl. No. 16/139,583 Corrected Ntc of Allowability dated Aug. 22, 2019, 7 pages, Doc 9066.
U.S. Appl. No. 16/139,583 Issue Notification dated Sep. 4, 2019, 1 page, Doc 9067.
PCT/US12/60798 International Search Report dated Mar. 27, 2013, 3 pages, Doc 9068.
PCT/US12/60798 Written Opinion of the International Searching Authority dated Mar. 27, 2013, 4 pages, Doc 9069.
PCT/US12/60798 International Preliminary Report on Patentability dated Apr. 22, 2014, 5 pages, Doc 9070.
CN201280051526 The First Office Action dated Jun. 17, 2016, 9 pages, Doc 9071.
CN201280051526 Amended Claims and Response to The First Office Action dated Jul. 15, 2016, 33 pages, Doc 9072.
CN201280051526 Notification of Grant dated May 25, 2017, 2 pages, Doc 9073.
U.S. Appl. No. 61/548,360, Patent Application as filed Oct. 18, 2011, 25 pages, Doc 9074.
U.S. Appl. No. 61/548,360 Filing Receipt dated Oct. 27, 2011, 3 pages, Doc 9075.
Examiner Initialed 1449s/SB08s for U.S. Appl. No. 13/654,113 considered May 6, 2013, 1 pg, Doc 9076.
Examiner Initialed 1449s/SB08s for U.S. Appl. No. 13/654,113 considered Sep. 18, 2013, 1 pg, Doc 9077.
Examiner Initialed 1449s/SB08s for U.S. Appl. No. 14/294,642 considered Nov. 14, 2014, 2 pgs, Doc 9078.
Examiner Initialed 1449s/SB08s for U.S. Appl. No. 15/227,056 considered Sep. 27, 2016, 2 pgs, Doc 9079.
Examiner Initialed 1449s/SB08s for U.S. Appl. No. 16/139,583 considered Nov. 11, 2018, 2 pgs, Doc 9080.

\* cited by examiner

MULTI-LAYER POWER CONVERTER WITH DEVICES HAVING REDUCED LATERAL CURRENT

RELATED APPLICATIONS

This application is a continuation of U.S. application Ser. No. 16/139,583, filed Sep. 24, 2018, now U.S. Pat. No. 10,424,564, issued on Sep. 24, 2019, which is a continuation of U.S. application Ser. No. 15/277,056, filed on Sep. 27, 2016, now U.S. Pat. No. 10,083,947, issued on Sep. 25, 2018, which is a continuation of U.S. application Ser. No. 14/294,642, filed on Jun. 3, 2014, now U.S. Pat. No. 9,497,854, issued on Nov. 15, 2016, which is a divisional of U.S. application Ser. No. 13/654,113, filed on Oct. 17, 2012, now U.S. Pat. No. 8,743,553, issued on Jun. 3, 2014, which claims the benefit of the priority date of U.S. Provisional Application No. 61/548,360, filed on Oct. 18, 2011, the contents of which are herein incorporated by reference.

FIELD OF DISCLOSURE

The present invention relates to energy storage elements in power converters that use capacitors to transfer energy.

BACKGROUND

Power converters generally include switches and one or more capacitors, for example, to power portable electronic devices and consumer electronics. A switch-mode power converter is a specific type of power converter that regulates its output voltage or current by switching storage elements (i.e. inductors and capacitors) into different electrical configurations using a switch network.

One type of switch-mode power converter is the switched capacitor converter. A switched capacitor converter uses capacitors to transfer energy. As the transformation ratio increases, the number of capacitors and switches increases.

A switch capacitor converter includes a switch network containing numerous switches. These switches are active devices that are usually implemented with transistors. The switch network can be integrated on a single or on multiple monolithic semiconductor substrates.

Typical power converters perform voltage transformation and output regulation. In many power converters, such as a buck converter, this is carried out in a single stage. However, it is also possible to split these two functions into two specialized stages. Such two-stage power converter architectures feature a transformation stage and a separate regulation stage. The transformation stage transforms one voltage into another, while the regulation stage ensures that the voltage and/or current output of the transformation stage maintains desired characteristics.

An example of a two-stage power converter architecture is illustrated in FIG. 1A, where capacitors are utilized to transfer energy. The transformation stage is represented by a switched-capacitor element 12A, which closely resembles a switched capacitor converter while the regulation stage is represented by a regulating circuit 16A.

In this architecture, a switched capacitor element 12A is electrically connected to a voltage source 14 at an input end thereof. An input of a regulating circuit 16A is electrically connected to an output of the switched capacitor element 12A. A load 18A is then electrically connected to an output of the regulating circuit 16A. Such a converter is described in US Patent Publication 2009/0278520, filed on May 8, 2009, the contents of which are herein incorporated by reference. Furthermore, a modular multi-stage power converter architecture was described in PCT Application PCT/2012/36455, filed on May 4, 2012, the contents of which are also incorporated herein by reference.

The switched capacitor element 12A and regulating circuit 16A can be mixed and matched in a variety of different ways. This provides a transformative integrated power solution (TIPS™) for the assembly of such converters. As such, the configuration shown in FIG. 1A represents only one of multiple ways to configure one or more switched capacitor elements 12 with one or more regulating circuits 16A.

Typically, the switch network of the switched capacitor element 12A and the regulating circuit 16A are fabricated in a semiconductor process that has passive devices. However, these passive devices are normally used in the analog circuitry to control the power converter. They are not normally used to store energy in the power converter. This is because these passive devices cannot efficiently store a significant amount of energy.

These passive devices are usually planar and fabricated after the active devices in a higher level of metal to reduce parasitic effects. Since these passive devices are fabricated after the active devices, and on the same wafer as the active devices, the processing steps for making these passive devices should be chosen carefully. An incorrect choice may damage the active devices that have already been fabricated.

To avoid possibly damaging the active devices during fabrication of the passive devices, it is preferable to only use CMOS compatible processing. Given this processing requirement, it is difficult and/or expensive to achieve high capacitance density capacitors or high Q inductors in a CMOS flow. Therefore, in power converters, it is common practice to store energy in discrete components, such as multilayer ceramic capacitors and chip inductors. However, it is possible to produce inexpensive high performance passive devices in their own wafer and process flow that can be used in specific applications. These devices will be referred to as integrated passive devices (IPDs).

An implementation of the power converter architecture shown in FIG. 1A is illustrated in FIG. 1B-1D.

In the embodiment shown in FIG. 1B, a power converter 20 draws energy from a voltage source 14 at a high input voltage VIN and delivers that energy to a load 18A at a low output voltage VO. Without loss of generality, the load 18A is modeled as a resistor.

The power converter 20 includes a switched capacitor element 12A that features a 3:1 series-parallel switched capacitor network having power switches S1-S7 and pump capacitors C21-C22. In contrast, the regulating circuit 16A is a buck converter having first and second output power switches SL, SH, a filter inductor L1, and an output capacitor CO. The power switches S1-S7, the output power switches SL, SH, and the driver/control circuitry 23 are integrated in a single semiconductor die 22. However, the pump capacitors C21-C22, the filter inductor L1, and a decoupling input capacitor CIN1 are discrete components.

In operation, the power switches S1, S3, S6 and the power switches S2, S4, S5, S7 are always in complementary states. Thus, in a first switch state, the power switches S1, S3, S6 are open and the power switches S2, S4, S5, S7 are closed. In a second switch state, the power switches S1, S3, S6 are closed and the power switches S2, S4, S5, S7 are open. Similarly, the output power switches SL, SH are in complementary states.

Typically, the regulating circuit 16A operates at higher switching frequencies than the switched capacitor element 12A. However, there is no requirement of any particular relationship between the switching frequencies of the regulating circuit 16A and the switching frequency of the switched capacitor element 12A. The driver/control circuitry 23 provides the necessary power to activate the switches and controls the proper switch states to ensure a regulated output voltage VO.

In power converters, it is common practice to solder a semiconductor die 22 or packaged die to an electrical interface 28, and to then horizontally mount capacitors and inductors on the electrical interface 28 around the semiconductor die 22. Such an arrangement is shown in a top view in FIGS. 1D and 1n a side view in FIG. 1C taken along a line 24 in FIG. 1D.

An electrical interface 28 provides electrical conductivity between the power converter 20 and a load to which the power converter 20 is ultimately supplying power. Examples of electrical interfaces 28 include printed circuit boards, package lead frames, and high density laminates.

The discrete components in the power converter 20 include the pump capacitors C21-C22, the input capacitor CIN1, the output capacitor CO, and the filter inductor L1. These discrete components are horizontally disposed with respect to the semiconductor die 22 and electrically coupled to the die 22 by traces on the electrical interface 28.

Each power switch in the power converter 20 is typically composed of numerous smaller switches connected in parallel as illustrated by the close-up 26 in FIG. 1D. This allows the power switches to carry a large amount of current without overheating.

SUMMARY

In one aspect, the invention features an apparatus including a power converter circuit, the power converter circuit including a first active layer having a first set of switching devices disposed on a face thereof, a first passive layer having first set of passive devices disposed on a face thereof, and interconnection to enable the switching devices disposed on the face of the first active layer to be interconnected with the non-active devices disposed on the face of the first passive layer, wherein the face on which the first set of switching devices on the first active layer is disposed faces the face on which the first set of passive devices on the first passive layer is disposed.

In some embodiments, the face on which the first set of switching devices on the first active layer is disposed faces the face on which the first set of passive devices on the first passive layer is disposed.

In some embodiments, the interconnection to enable the switching devices disposed on the face of the first active layer to be interconnected with the passive devices disposed on the face of the first passive layer includes a thru via extending through at least one of the first active layer and the first passive layer. Among these embodiments are those in which the interconnection to enable the switching devices disposed on the face of the first active layer to be interconnected with the passive devices disposed on the face of the first passive layer further includes an interconnect structure connected to the thru via and to one of the first active layer and the first passive layer.

In other embodiments, the power converter circuit further includes one or more additional layers. Among these embodiments are those in which the one or more additional layers comprise a second passive layer containing a second set of passive devices, those in which the one or more additional layers includes a second active layer containing a second set of switching devices, and those in which the one or more additional layers comprise a second layer having a face on which a third set of devices is disposed and a third layer having a face on which a fourth set of devices is disposed, and wherein the face on which the fourth set of devices is disposed faces the face on which the third set of devices is disposed.

Also among the embodiments are those in which the first passive layer includes an energy-storage element. Among these are those in which the energy-storage element includes a capacitor. In some of these embodiments, the capacitor includes a planar capacitor, whereas in others, the capacitor includes a trench capacitor.

Some embodiments include an electrical interface, and a connection between the electrical interface and the first active layer of the circuit. Others include an electrical interface, and a connection between the electrical interface and the first non-active layer of the circuit.

In some embodiments, the power converter circuit further includes vias extending through the first active layer. Among these are embodiments in which the power converter circuit further includes vias extending through the first passive layer.

Also included among the embodiments of the invention are those in which the power converter circuit further includes additional layers, wherein the additional layers comprise a second active layer and a third active layer, the apparatus further including a thru via connected the second active layer and the third active layer.

In addition to all the foregoing embodiments, additional embodiments of the invention are those in which the power converter circuit further includes additional layers, wherein the additional layers comprise a second passive layer and a third passive layer, the power converter circuit further including a thru via providing an electrical connection between the second passive layer and the third passive layer.

The power converter circuit can implement any power converter circuit. In one embodiment, the power converter circuit implements a buck converter. In another embodiment, the power converter circuit implements a switched capacitor circuit.

In some embodiments, the first passive layer includes capacitors. Among these embodiments are those that further include an electrical interface and solder bumps connecting the power converter circuit to the electrical interface, wherein the solder bumps are disposed according to a solder bump pitch, and wherein the interconnection has an interconnection pitch, the interconnection pitch being smaller than the solder bump pitch, as well as those in which at least one of the capacitors is sized to fit at least one of above a switching device in the first active layer and below a switching device in the first active layer.

In some embodiments, the electrical interconnect includes a multilayer interconnect structure.

Other embodiments include a driver and control unit to provide power and to control the switching devices.

In some embodiments, the apparatus also includes a data processing unit and a touch-screen interface, both of which are configured to consume power provided by said switched mode power converter circuit. Among these are embodiments that also include a wireless transmitter and receiver, all of which are configured to consume power provided by said switched mode power converter circuit. Examples of such embodiments are smart phones, tablet computers, laptop computers, and other portable electronic devices.

In another aspect, the invention features an apparatus including passive layers, active layers, thru vias, and at least one interconnection layer. The interconnection layer provides electrical connection between an active layer and a passive layer. The thru vias provide electrical connection between two or more active layers, or between two or more passive layers.

In another aspect, the invention features an apparatus having a power converter circuit including a stack of layers, the stack including an active layer having active devices integrated on a device face thereof and a passive layer having passive devices integrated on a device face, thereof. Either an active device or a passive device is partitioned into at least two partitions. Each partition defines a current channel along a first axis, The partitioned component thus suppresses current flow along a second axis orthogonal to the first axis.

In some embodiments, the passive devices include a planar capacitor.

Other embodiments include a regulating circuit having a first regulating circuit partition and a second regulating circuit partition. The regulating circuit is connected to receive an output from the power converter circuit. The embodiment also includes a first inductor having a first terminal and a second terminal, the first terminal being connected to an output of the first regulating circuit partition, and the second terminal being connected to a load, a second inductor having a first terminal and a second terminal, the first terminal being connected to an output of the second regulating circuit partition, and the second terminal being connected to the second terminal of the first inductor, whereby in operation, the second terminal of the first inductor and the second terminal of the second inductor are at a common potential. Among these embodiments are those that include a load connected to the second terminal of the first inductor and the second terminal of the second inductor.

In some embodiments, the first switched capacitor unit is positioned over the first regulating circuit partition at a location that minimizes an extent to which current travels between the power converter circuit and the first regulating circuit partition.

These and other features of the invention will be apparent from the following description and the accompanying figures in which:

DETAILED DESCRIPTION

Power converters that use capacitors to transfer energy have certain disadvantages when packaged in the traditional way. Such power converters require a larger number of components and a larger number of pins than conventional topologies. For example, power converter 20 requires two additional capacitors and four additional pins when compared to a buck converter.

Furthermore, extra energy is lost due to parasitic losses in the interconnection structure between the additional capacitors and the devices in the switch network. The devices and methods described herein address these issues by vertically integrating the passive devices with the active devices within a power converter.

Embodiments described herein generally include three components: a passive device layer 41A, also referred to a "passive layer", an active device layer 42A, also referred to as an "active layer", and an interconnect structure 43B. Each layer has devices that will typically be integrated on a single monolithic substrate or on multiple monolithic substrates, both of which may also be incorporated within a reconstituted wafer as in the case of fan-out wafer scale packaging. The passive layer 41A can be fabricated by an IPD process while the active layer 42A can be fabricated by a CMOS process. Each device layer pair is electrically connected together through a high density interconnect structure, which may also include a redistribution layer or micro bumps.

Additionally, thru vias 47A can be included which allow electrical connections to additional device layers. In the case of a single monolithic substrate, the thru vias may include thru silicon vias, whereas in the case of a reconstituted wafer, the thru vias may include thru mold vias.

Figure 2A:
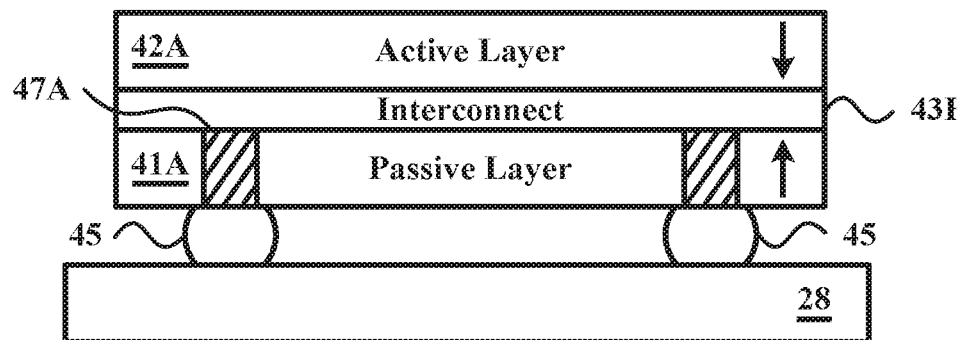
FIGS. 2A-2C are side views of various power converters with integrated capacitors.
Figure 2B:
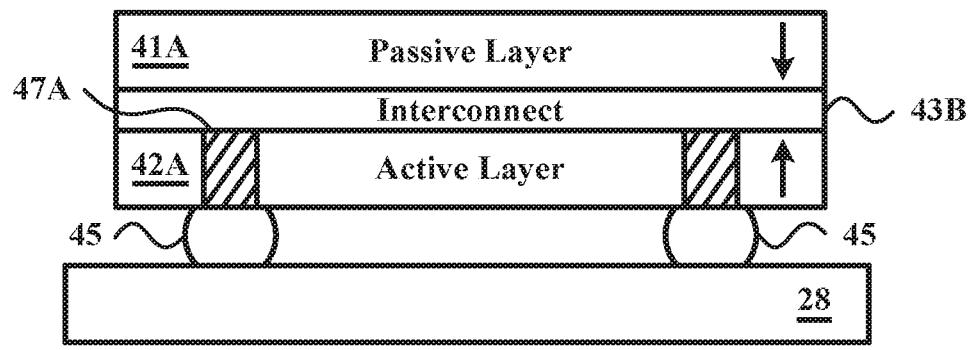
Figure 2C:
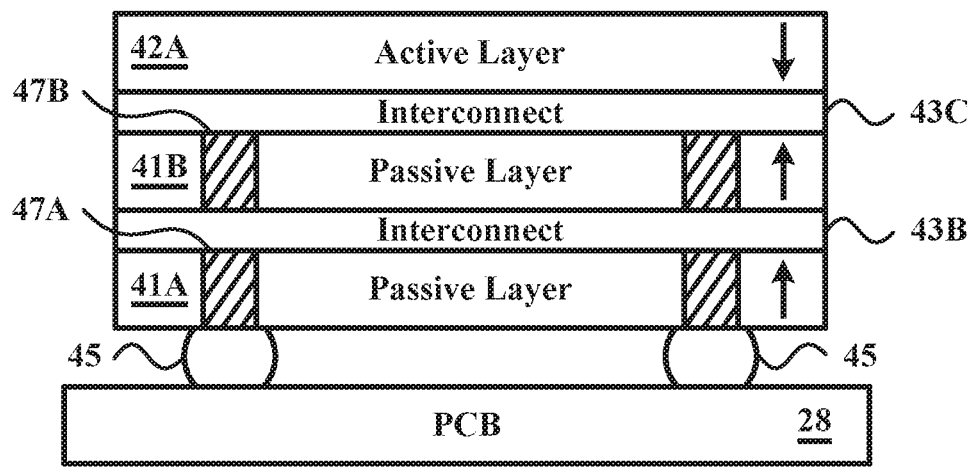

Side views of three different embodiments with thru vias 47A are illustrated in FIGS. 2A-2C. These are only a few of the possible permutations. Each side-view includes at least a passive layer 41A, an active layer 42A, thru vias 47A, and an interconnect structure 43B.

The passive layer 41A includes passive devices such as capacitors, inductors, and resistors. The active layer 42A includes active devices such as transistors and diodes. The interconnect structure 43B provides electrical connections between the passive layer 41A and the active layer 42A. Meanwhile, thru vias 47A allow for electrical connections to pass thru the passive layer 41A or thru the active layer 42A.

The interconnect structure 43B can also provide electrical connection between devices on the same layer. For example, separate active devices in different locations on the active layer 42A can be electrically connected using the interconnect structure 43B.

In the particular embodiment shown in FIG. 2A, the passive layer 41A is between the active layer 42A and the electrical interface 28. An interconnect structure 43B provides interconnections between devices on the active layer 42A and devices on the passive layer 41A. The interconnect structure 43B in some cases can also provide electrical connections between two devices that are on the same passive layer 41A or two devices on the same active layer 42A. Each device layer 41A, 42A has a device face on which the devices are actually formed. The locations of these device faces are indicated by the pair of arrows.

In the embodiment of FIG. 2A, the device face on the active layer 42A faces, or is opposed to, the device face on the passive layer 41A. Thru vias 41A cut through the passive layer and connect to the interconnect structure 43B. Thus, the path between devices on layers separated by intervening layers generally includes at least a portion through an interconnect structure 34B and a portion through a via 41A. In this way, the interconnect structure 34B provides electrical continuity between devices in different layers, whether the layers are adjacent or otherwise.

In the alternative embodiment shown in FIG. 2B, the active layer 42A is between the passive layer 41A and the electrical interface 28. Thru vias 42A in this case pass through the active layer 42A. Once again, an interconnect structure 43B connects the passive devices on the passive layer 41A, the active devices on the active layer 42A, and the thru vias 47A. Once again, as indicated by the arrows, the device face of the passive layer 41A and the device face of the active layer 42A are opposite each other.

As shown in yet another embodiment in FIG. 2C, it is also possible to use more than two device layers by stacking one or more passive layers and one or more active layers. In the particular embodiment shown in FIG. 2C, such a stack includes first and second passive layers 41A-41B capped by an active layer 42A. The embodiment further includes a first interconnect structure 43B between the first and second passive layers 41A, 41B and a second interconnect structure 43C between the second passive layer 41B and the active layer 42A. As indicated by the arrows, the device faces of the second passive layer 41B and the active layer 42A face each other, but the device faces of the first and second passive layers 41A, 41B do not.

Figure 1A:
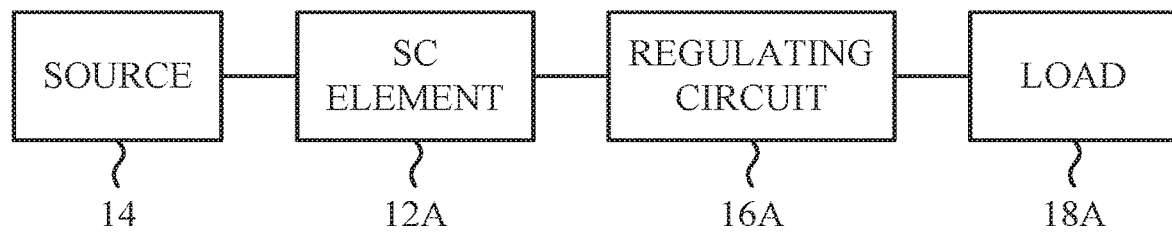
FIG. 1A is a block diagram of a known power converter architecture.
Figure 1B:
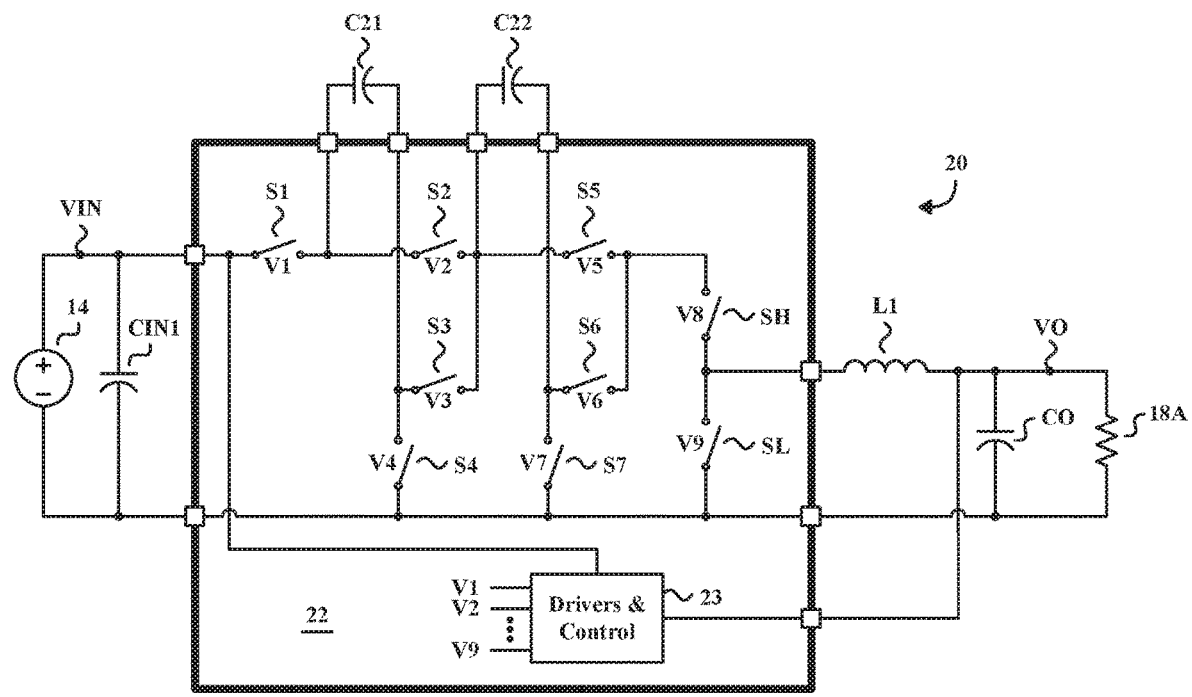
FIG. 1B is a particular implementation of the converter architecture shown in FIG. 1.

The embodiment shown in FIG. 2A-2C can be used to eliminate the pin count penalty in power converter 20 shown in FIG. 1B.

Figure 3A:
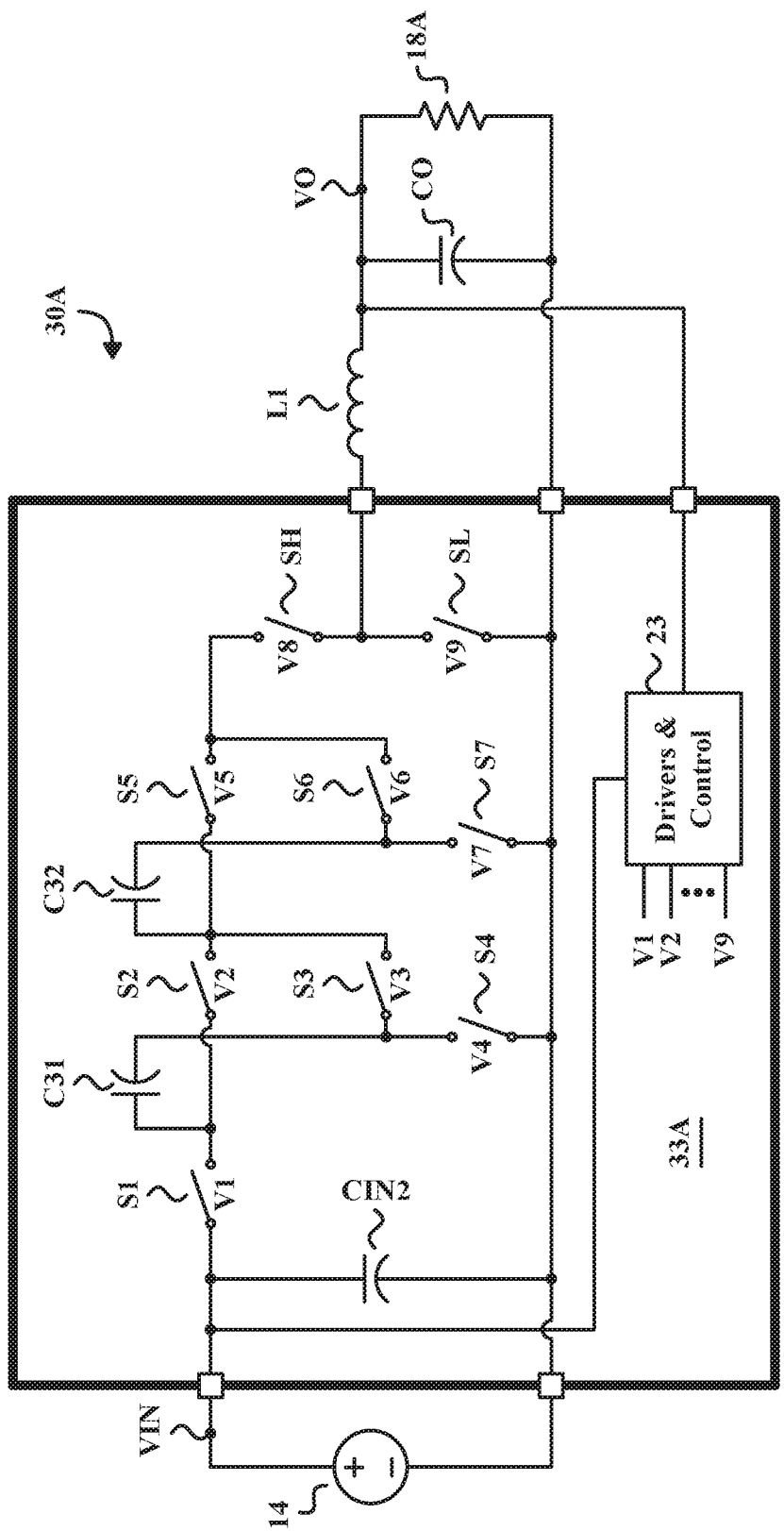
FIG. 3A is a circuit diagram of a power converter with integrated capacitors.

As illustrated in FIG. 3A, the discrete capacitors C21, C22, CIN1 in the power converter 20 are replaced by integrated capacitors C31, C32, CIN2 respectively that are all placed on a passive layer 41A (not shown). Meanwhile, the active devices S1-S7, SL-SH, and control circuit 23 are all included in a separate active layer 42A that would be stacked relative to the passive layer as suggested by FIGS. 2A-2C. The resulting power converter 30A has three fewer discrete capacitors and four fewer pins than the power converter 20.

Figure 3B:
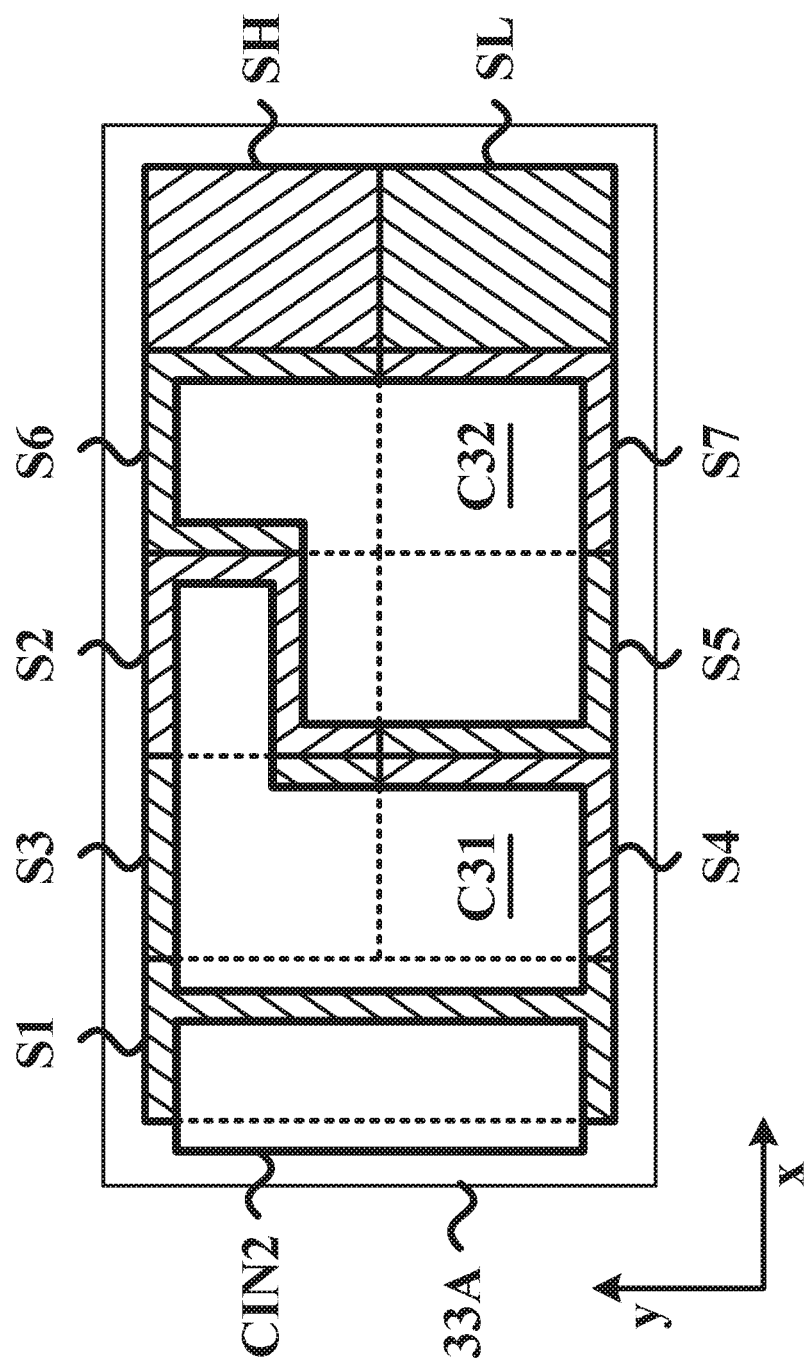
FIG. 3B is a top view of one layout of the power converter whose circuit is shown in FIG. 3A.

A top view of the power converter 30A in FIG. 3B illustrates the disposition of active and passive devices on separate layers coplanar with an xy plane defined by the x and y axes shown and stacked along a z axis perpendicular to the xy plane. The capacitors C31, C32, CIN2 are disposed on a device face of a passive layer over a device face of an active layer, on which are formed active devices S1-S7.

Figure 1C:
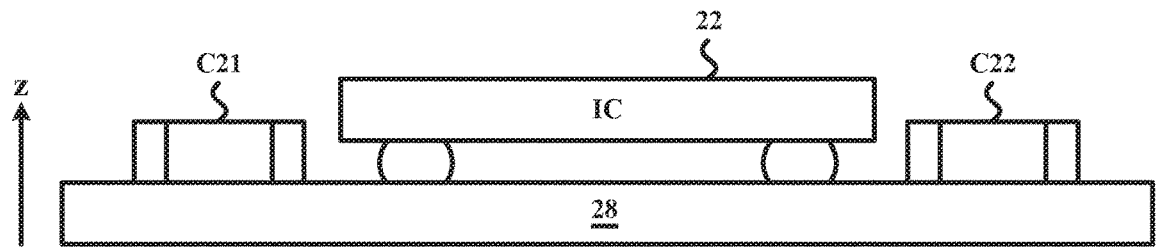
FIG. 1C is a side view of the power converter illustrated in FIG. 1B.
Figure 1D:
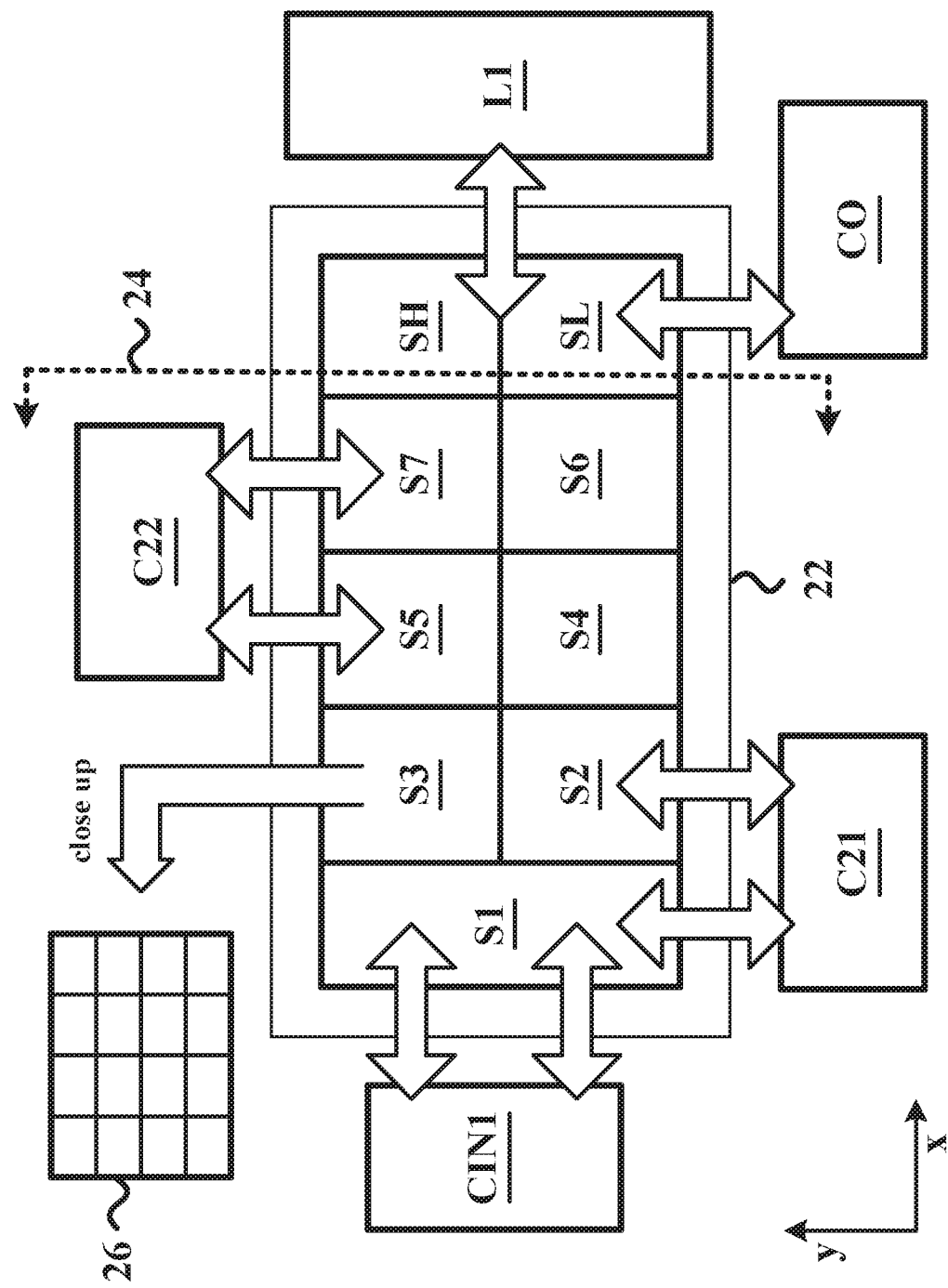
FIG. 1D is a top view of the power converter illustrated in FIG. 1B.

Each capacitor is arranged such that it is directly above the particular active device to which it is to be electrically connected. For example, a first capacitor C31 is directly above switches S1-S4. This is consistent with FIG. 3A, which shows that the positive terminal of the first capacitor C31 is to be connected to first and second switches S1, S2 while the negative terminal of the first capacitor C31 is to be connected to third and fourth switches S3, S4. This arrangement shortens the distance current needs to flow between the active devices and the passive devices in comparison to the arrangement illustrated in FIG. 1B-1D, thereby reducing the energy loss.

FIG. 3B shows another power converter 30B, often referred to as a four-level flying capacitor buck converter. It is a particular implementation of a multi-level buck converter. Other examples include three-level fly capacitor buck converters and five-level capacitor buck converters. Such power converters incorporate a switched-capacitor circuit and can readily be implemented using stacked layers as illustrated in FIGS. 2A-2C.

If the power converter 30B is implemented using the embodiment illustrated in FIG. 2A, then the device stack 33B includes a top active layer 42A and a bottom passive layer 41A. The active devices S31-S36 are included in the active layer 42A, while the fly capacitors C3A-C3B are included in the passive layer 41A. The fly capacitors C3A-C3B are vertically disposed below the active devices S31-S36 to reduce the energy loss in the electrical interconnection.

In operation, the input voltage VIN is chopped using the active devices S31-S36 and the two fly capacitors C3A-C3B. This results in a pulsating voltage at an output node LX. This pulsating voltage is presented to an LC filter represented by a filter inductor L31 and a load capacitor CL, thereby producing an output voltage VO, which is the average of the voltage at the LX node.

Figure 4:
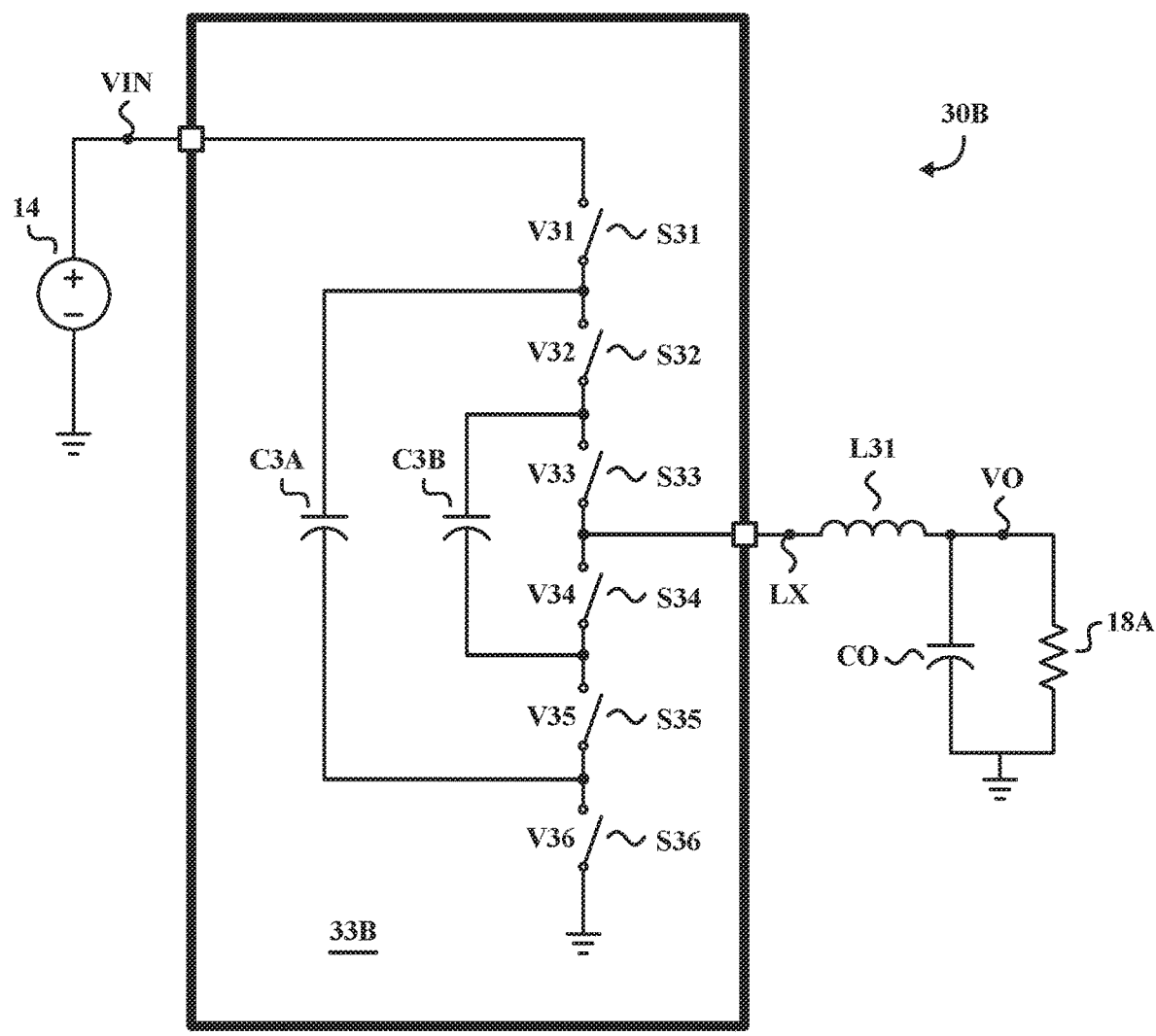
FIG. 4 is a circuit diagram of a four-level buck converter with integrated capacitors.

In the remaining description of FIG. 4, the power converter 30B is assumed to be connected to a 12 volt source 14 and to provide 4 volts to the load 18A. The power converter 30B is in one of eight different states. Depending upon the state, the voltage at the output node LX is 12 volts, 8 volts, 4 volts or 0 volts, assuming that the first fly capacitor C3A is charged to 8 volts and that the second fly capacitor C3B is charged to 4 volts.

The power converter 30B alternates between combinations of the states depending upon the desired output voltage VO. Additionally, the duration of time the power converter 30B is in each state enables regulation of the output voltage VO. It is important to note that the power converter 30B always operates such that the fly capacitors C3A-C3B are charged as much as they are discharged. This maintains a constant average voltage across the fly capacitors C3A-C3B.

Figure 5:
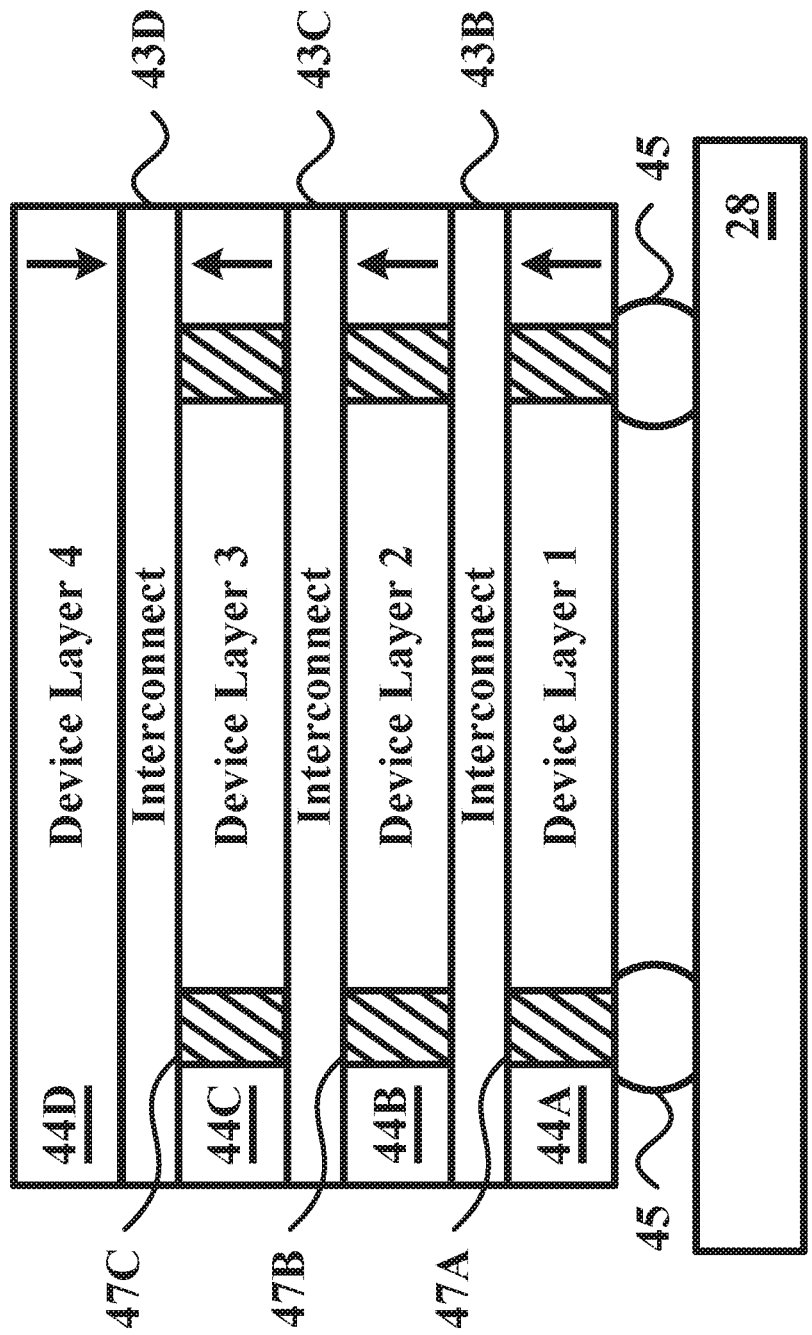
FIG. 5 is a side view of a power converter with generic device layers.

A generalization of the embodiments illustrated in FIGS. 2A-2C is illustrated in FIG. 5, which includes four device layers 44A-44D. In general, at least two device layers are required, one of which includes active devices and the other of which includes passive devices. Typically, the pitch of the interconnect structure 43A-43D is finer than the pitch of the bumps 45, such as solder balls, gold studs, and copper pillars, that couple the power converter to the electrical interface 28. The individual capacitors in the layer with passive devices are sized and arranged so as to fit above or below one or more active devices. Furthermore, the switched capacitor elements are also partitioned and laid out in a specific way to reduce parasitic energy loss in the interconnect structures.

Since semiconductor processing is sequential, it is common to only process one side of a wafer. This adds one more dimension to the number of possible permutations. Assuming there is one active layer 42A, one passive layer 41A, one device face per layer, and thru vias 47A, there are a total of eight different ways of arranging the two layers.

FIGS. 6A-6C and FIG. 2A illustrate the four possible combinations in which the passive layer 41A is on top and the active layer 42A is on the bottom. As used herein, a "bottom" layer is the layer closest to the electrical interface and the "top" layer is the layer furthest from the electrical interface.

Figure 6A:
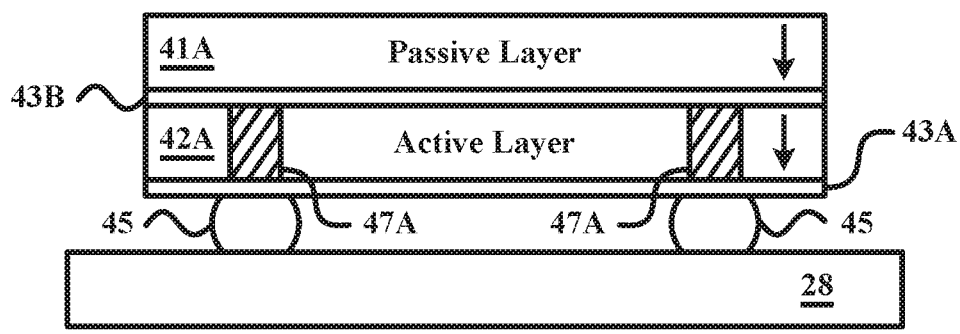
FIGS. 6A-6C are three side views of a power converter in which an active device layer is between a passive device layer and an electrical interface.

In FIG. 6A, the interconnect structure 43A electrically connects the active devices in layer 42A to thru vias 47A and bumps 45. Similarly, the interconnect structure 43B electrically connects the passive devices in layer 41A to thru vias 47A. As indicated by the arrows, the device faces of the passive and active layers 41A, 42A face away from each other.

Figure 6B:
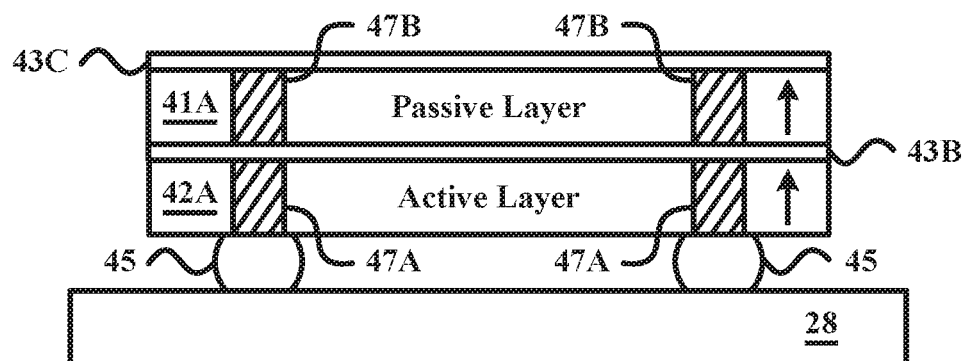

In FIG. 6B, the interconnect structure 43B electrically connects the active devices in layer 42A to thru vias 47A and thru vias 47B. Similarly, the interconnect structure 43C electrically connects the passive devices in layer 41A to thru vias 47B. As indicated by the arrows, the device faces of the passive and active layers 41A, 42A face away from each other.

Figure 6C:
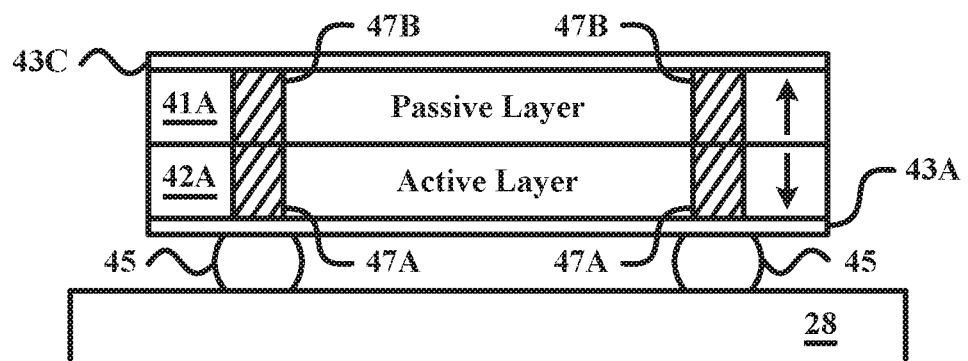

Lastly, in FIG. 6C, the interconnect structure 43A electrically connects the active devices in 42A to thru vias 47A and bumps 45. Similarly, the interconnect structure 43C electrically connects the passive devices in layer 41A to thru vias 47B. As indicated by the arrows, the device faces of the passive and active layers 41A, 42A, face away from each other.

In comparison, FIGS. 6D-6F and FIG. 2B illustrate the four possible combinations in which the active layer 42A is on top and the passive layer 41A is on the bottom.

Figure 6D:
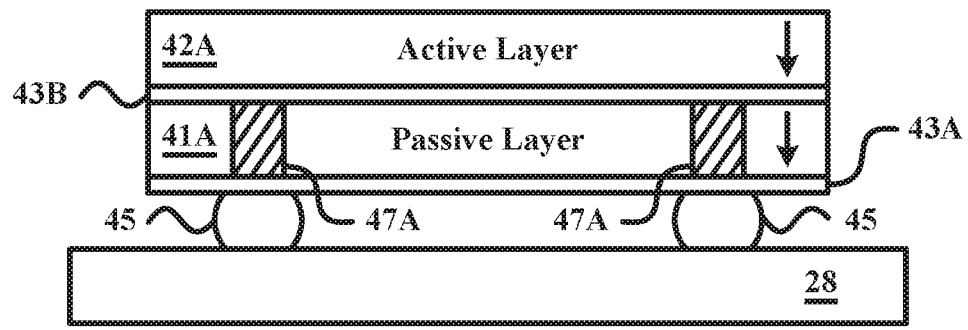
FIGS. 6D-6F are three side views of a power converter in which a passive device layer is between an active layer and the electrical interface.
Figure 6E:
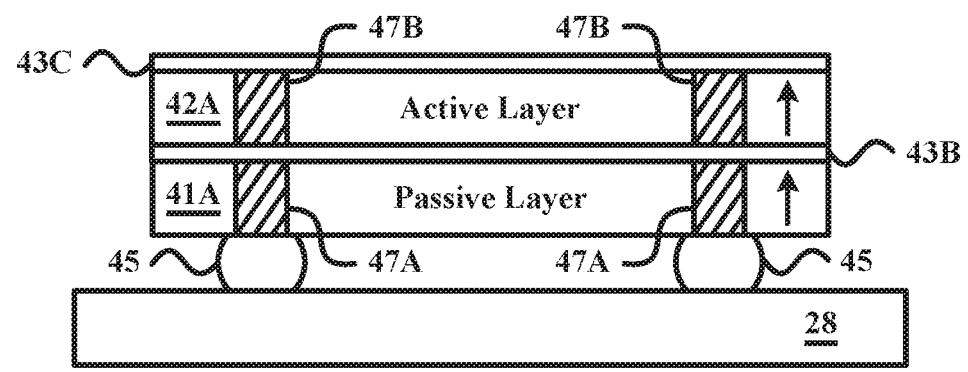
Figure 6F:
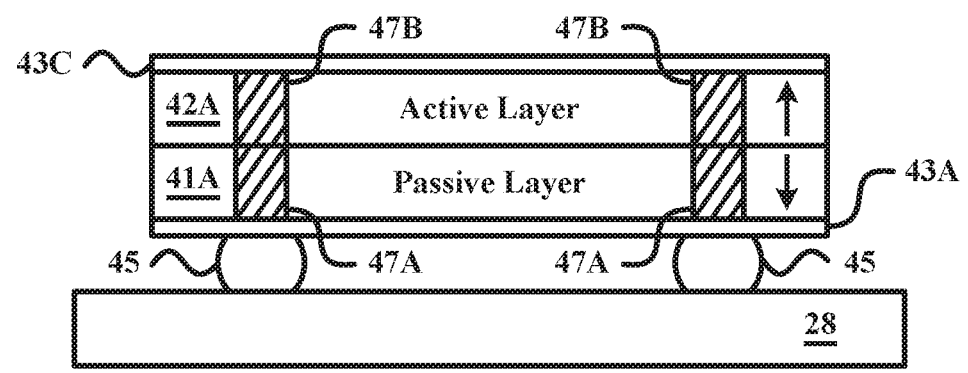

In FIGS. 6D-6F, the active layer 42A and the passive layer 41A are electrically connected together as described in connection with FIGS. 6A-6C. The choice of configuration depends upon numerous factors, most of which relate to thru via technology and to the number of pins to the outside world. For example, if there are a larger number of electrical connections between the passive layer 41A and active layer 42A than to the outside world than the configurations illustrated in FIG. 2A & FIG. 2B are more desirable. However, if the opposite is true than the configurations illustrated in FIG. 6A and FIG. 6D are more desirable.

Figure 7A:
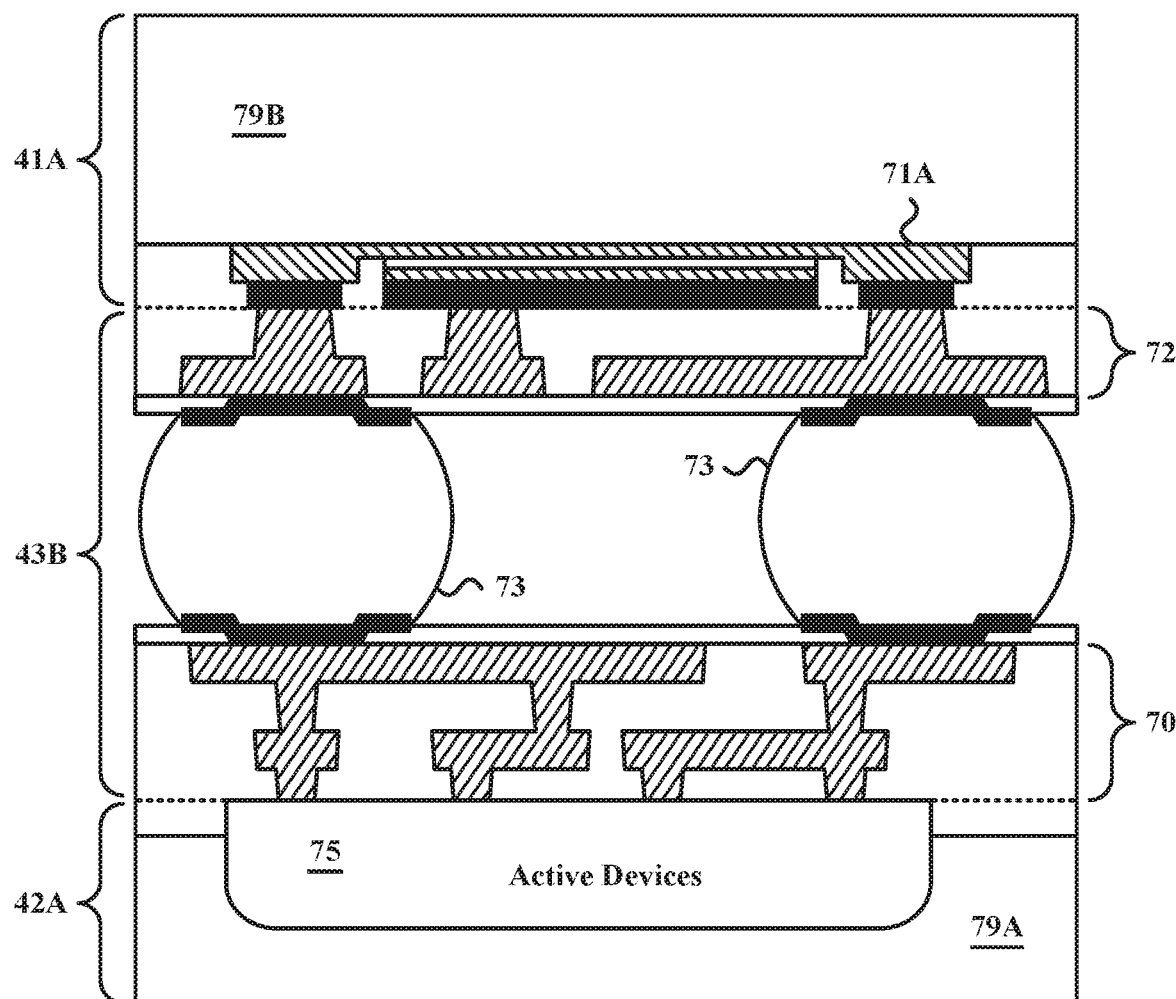
FIG. 7A is a side view of a power converter with a planar capacitor.
Figure 7B:
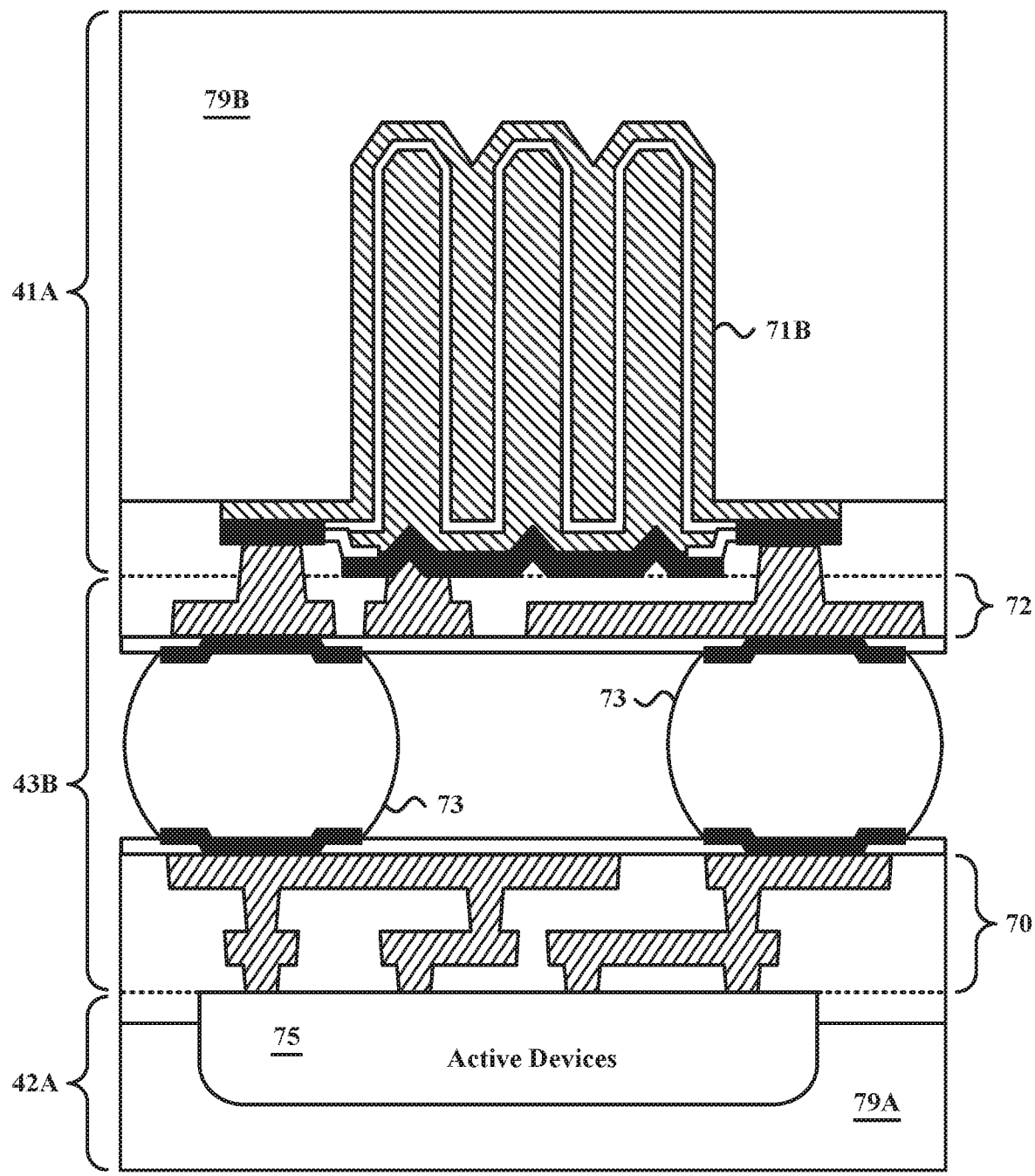
FIG. 7B is a side view of a power converter with a trench capacitor.

The passive substrate and active substrate can be in any form when attached, such as singulated dice or full wafers. Two different implementations that are amenable to die-to-die attachment are shown in FIGS. 7A-7B. Each implementation includes a different type of capacitor.

The capacitors can be of any structure. However, trench capacitors have a capacitance per unit area that is one to two orders of magnitude higher than that of an equivalent planar capacitor, and also have lower equivalent series resistance than equivalent planar capacitors. Both of these capacitor attributes are desirable for use in power converters that use capacitive energy transfer because they favorably affect the efficiency of the power converter.

In the embodiment shown in FIG. 7A, the passive layer 41A includes a planar capacitor 71A and the active layer 42A includes active devices 75. In contrast, the embodiment shown in FIG. 7B, includes a trench capacitor 71B in its passive layer 41A.

The interconnect structure 43B electrically connects the devices within the passive layer 41A to the devices within the active layer 42A. The interconnect structure 43B can be implemented in numerous ways, one of which are illustrated in FIGS. 7A and 7B.

In the case of FIGS. 7A-7B, the interconnect structure 43B is composed of a multilayer interconnect structure 72 on the passive substrate, a single layer of solder bumps 73, and a multilayer interconnect structure 70 on the active substrate.

The bumps 45 are not visible in FIGS. 7A-7B because their pitch on the electrical interface 28 is typically much larger than the interconnect structure 43B. However, to connect to the outside world, some form of connection, such as bumps 45 along with thru vias 47A, is useful.

The bumps 45 can either be located above the passive layer 41A or below the active layer 42A. In the case in which the bumps 45 are located above the passive layer 41A, the thru vias cut 47A through the passive layer 41A as illustrated in FIG. 2B. In the case in which the bumps 45 are located below the active layer 42A, the thru vias 47A cut through the active layer 42A as illustrated in FIG. 2A.

Figure 8A:
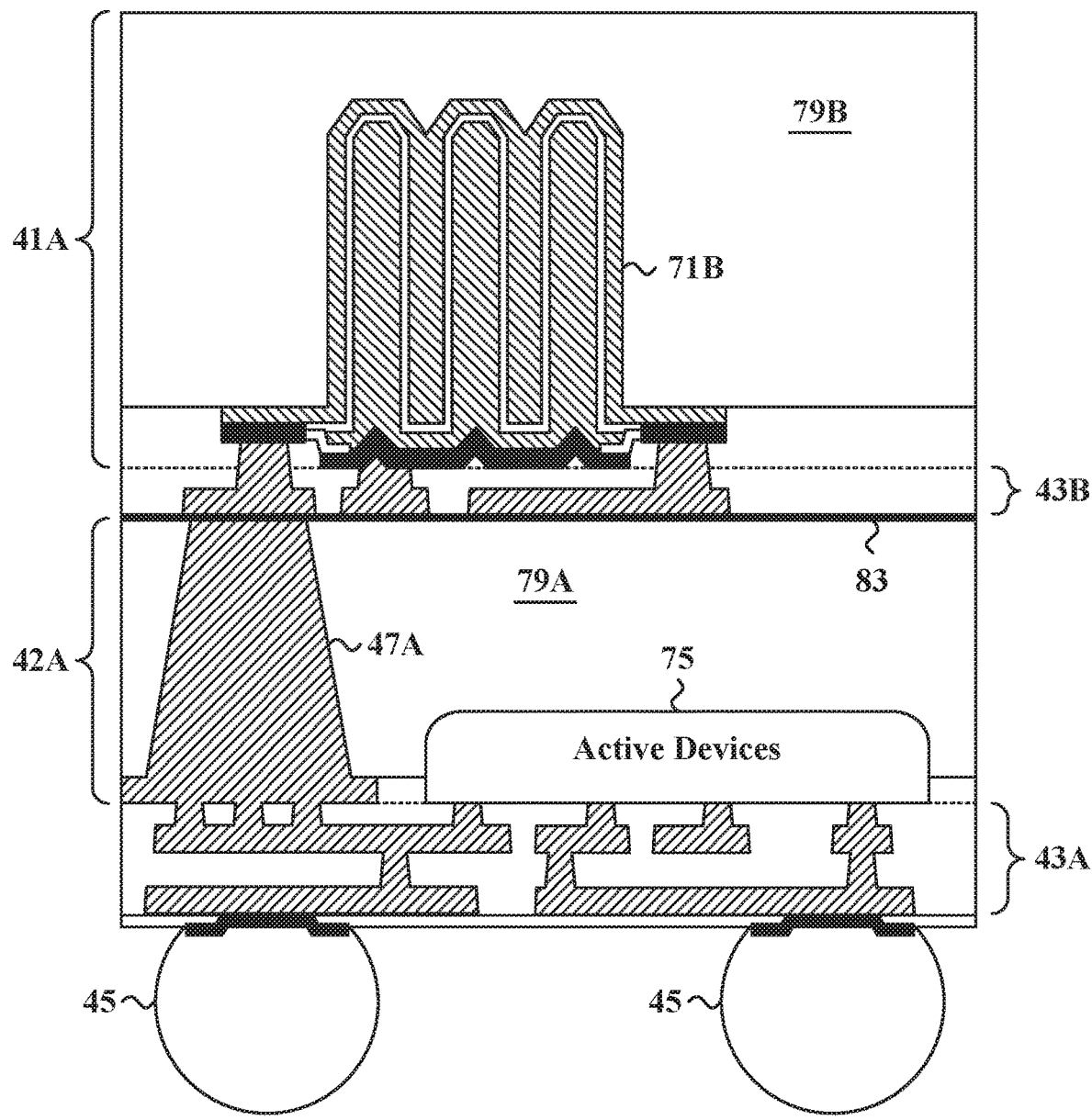
FIG. 8A is a particular implementation of the power converter shown in FIG. 6B.
Figure 8B:
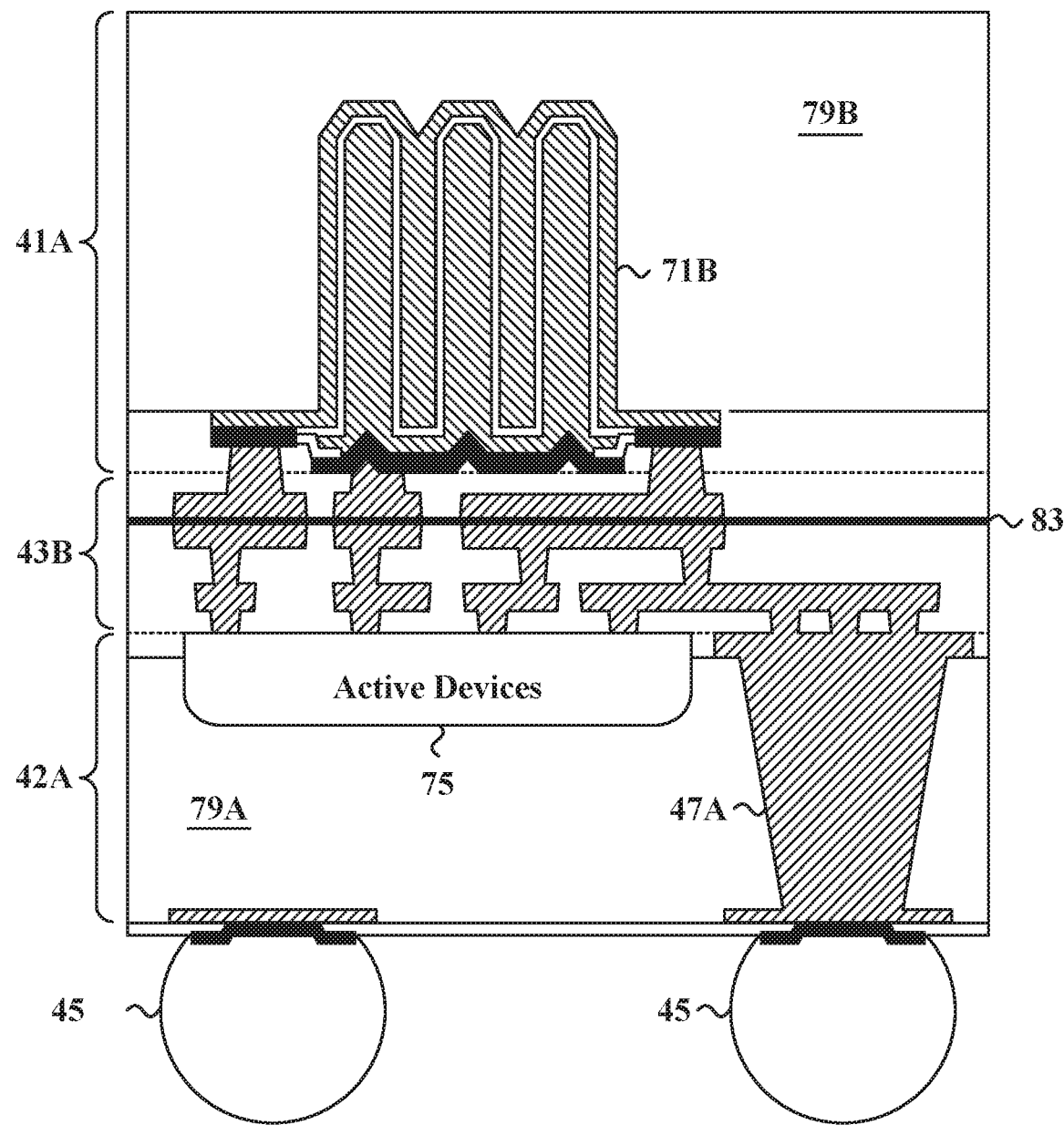
FIG. 8B is a particular implementation of the power converter shown in FIG. 6A.

Embodiments of this invention can also be implemented with wafer-to-wafer stacking as shown in FIGS. 8A-8B. The embodiment illustrated in FIG. 8A is a particular implementation of FIG. 6B, whereas, the embodiment illustrated in FIG. 8B is a particular implementation of FIG. 6A.

The two wafers are electrically connected together using a bonding layer 83 instead of using solder bumps 73 as in the case of FIGS. 7A-7B. There are numerous types of wafer-to-wafer bonding process. Among these are copper-copper bonding, oxide-oxide bonding, and adhesive bonding. Furthermore, FIGS. 8A-8B illustrate the thru vias 47A and their respective bumps 45, which were absent in FIGS. 7A-7B.

Power converters that rely on capacitors to transfer energy generally have complex networks with many switches and capacitors. The sheer number of these components and the complexity of the resulting network make it difficult to create efficient electrical interconnections between switches and capacitors.

Typically, metal layers on an integrated circuit or on integrated passive device are quite thin. Because thin metal layers generally offer higher resistance, it is desirable to prevent lateral current flow. This can be accomplished by controlling the electrical paths used for current flow through the power converter. To further reduce energy loss resulting from having to traverse these electrical paths, it is desirable to minimize the distance the current has to travel. If properly done, significant reductions energy loss in the interconnect structure can be realized. This is accomplished using two techniques.

One way to apply the foregoing techniques to reduce interconnection losses is to partition the switched capacitor element 12A into switched capacitor units operated in parallel, but not electrically connected in parallel. Another way is to choose the shape and location of the switches on the die to fit optimally beneath the capacitors and vice versa.

Figure 9A:
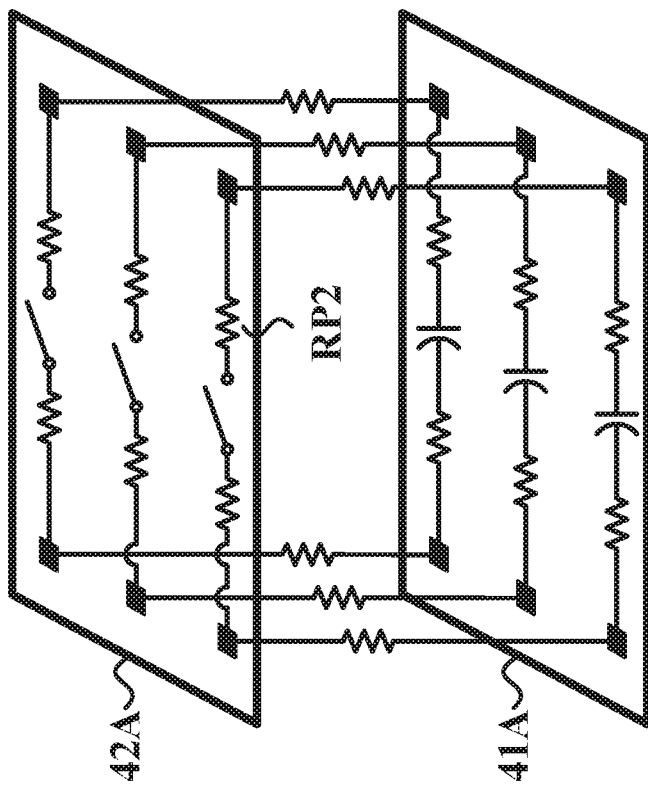
FIG. 9A shows a parasitic network between the active and passive layer with one node.

Partitioning the SC element 12A is effective because it reduces the horizontal current flow that has always been seen as inevitable when routing physically large switches and capacitors to a single connection point or node as depicted in FIG. 9A.

As is apparent from FIG. 9A, current in a physically large component will tend to spread out across the component. To the extent it spreads in the lateral direction, its path through the material becomes longer. This is shown in FIG. 9A by noting the difference between the path length between the two nodes through the center switch and the path length between the two nodes through the lateral switches. This additional path length results in loss, represented in the equivalent circuit by RP1.

By partitioning the component into smaller sections, one can equalize the path length differences between the two nodes, thus reducing associated losses. For example, if the switch and the capacitor in FIG. 9A are partitioned into three sections, the equivalent circuit is approximately that shown in FIG. 9B, in which the lumped resistances associated with the path between nodes is represented by a smaller lumped resistance RP2.

FIGS. 10A-10D illustrate the application of both of these techniques to the implementation of a power converter.

Figure 10A:
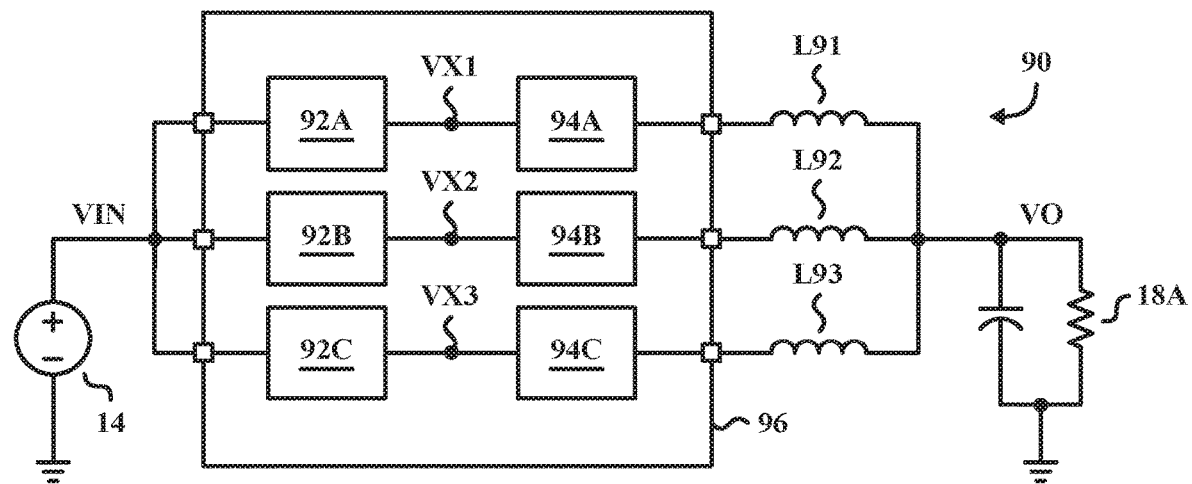
FIG. 10A is a block diagram of a partitioned power converter.

As shown in FIG. 10A, the regulating and switching components of a power converter 90 are partitioned to encourage a more direct electrical path between them, and to minimize any lateral current flow. In the particular example of FIG. 10A, the power converter 90 includes a switched capacitor unit 92A connected to a regulating circuit unit 94A at a first node VX1, a switched capacitor unit 92B connected to regulating circuit unit 94B at a second node VX2, and a switched capacitor unit 92C and regulating circuit unit 94C connected at a third node VX3. Furthermore, first inductor L91, second inductor L92, and third inductor L93 are located at the output of each regulating circuit units 94A-94C. These inductors L91-L93 are then shorted together at the load.

Figure 11:
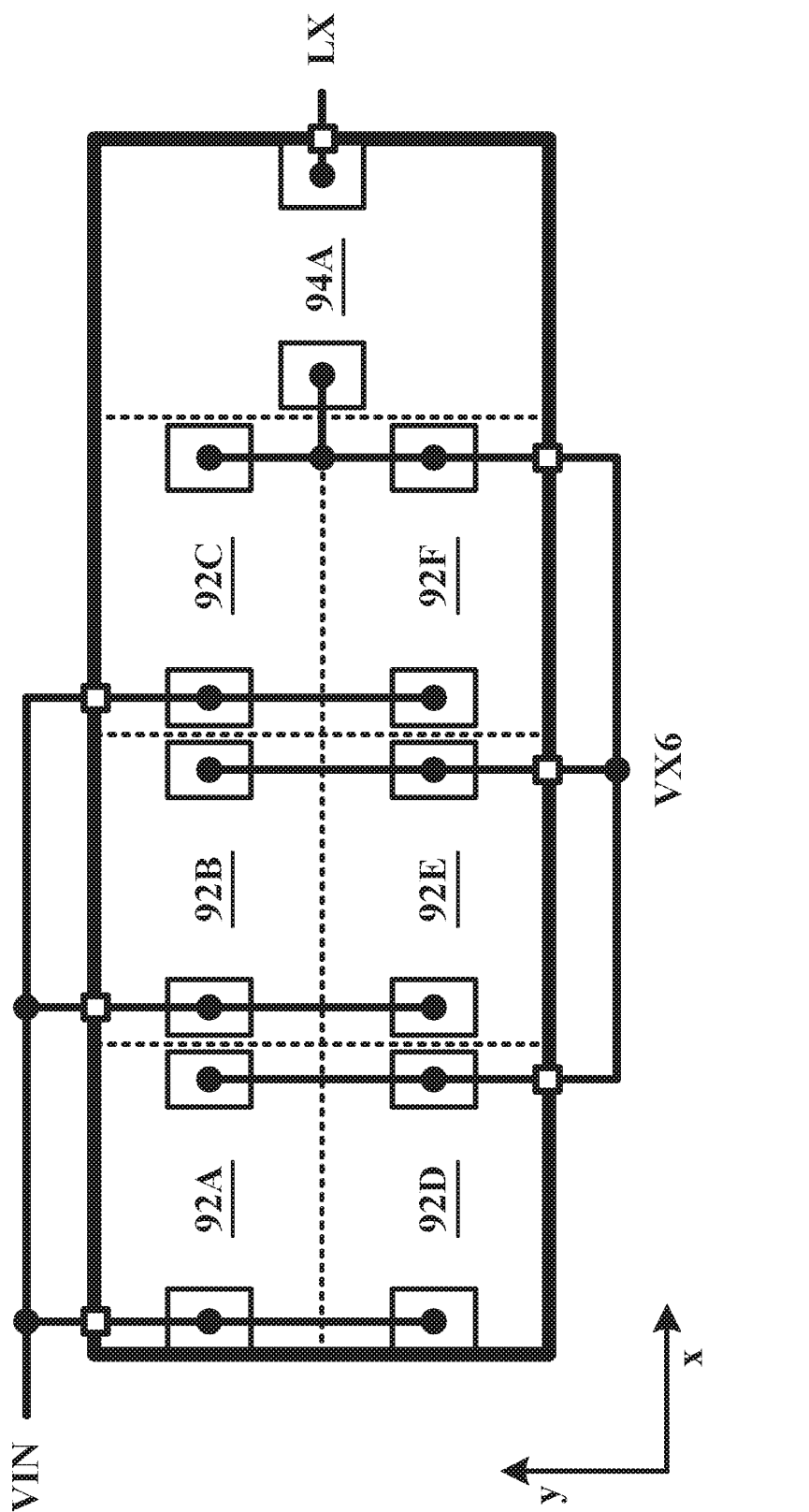
FIG. 11 is a top view of an alternative implementation of the partitioned power converter shown in FIG. 10A.

Although FIG. 10A shows both the regulating circuit 16A and the switching capacitor element 12A as both being partitioned, this is not necessary. It is permissible to partition one and not the other. For example, in the embodiment shown in FIG. 11, only the switching capacitor element 12A has been partitioned. A corollary that is apparent from the embodiment shown in FIG. 11 is that the number of partitions of regulating circuit 16A and the number of partitions of the switched capacitor element 12A need not be the same, as is the case in the particular example shown in FIG. 10A.

Figure 10B:
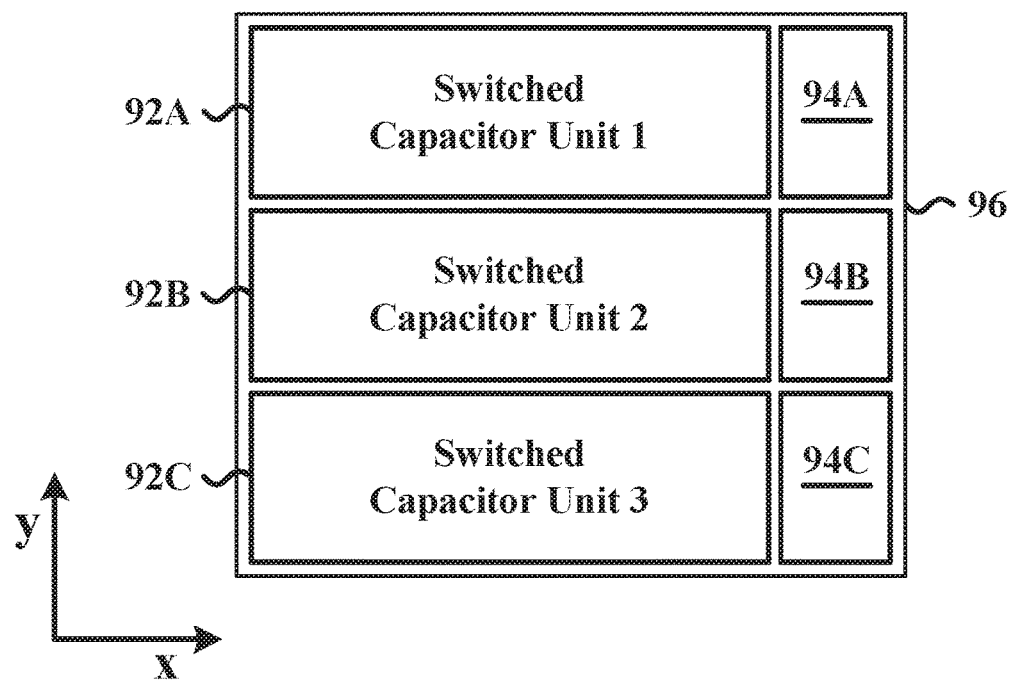
FIG. 10B is a top view of a particular implementation of the partitioned power converter shown in FIG. 10A.

A top view of the power converter 90 shown in FIG. 10A is illustrated in FIG. 10B. The switched capacitor units 92A-92C extend along they direction, where the first switched capacitor unit 92A is at the top, the second switched capacitor unit 92B is in the middle, and the third switched capacitor unit 92C is at the bottom. The regulating circuit units 94A-94C extend along they direction as well.

Like the power converter 30A shown in FIGS. 3A-3B, the device stack 96 includes a top passive layer 41A and a bottom active layer 42A. The capacitors within the switched capacitor units 92A-92C are included in the passive layer 41A, whereas the active devices within the switched capacitor units 92A-92C and regulating circuit units 94A-94C are include in the active layer 42A.

Figure 10C:
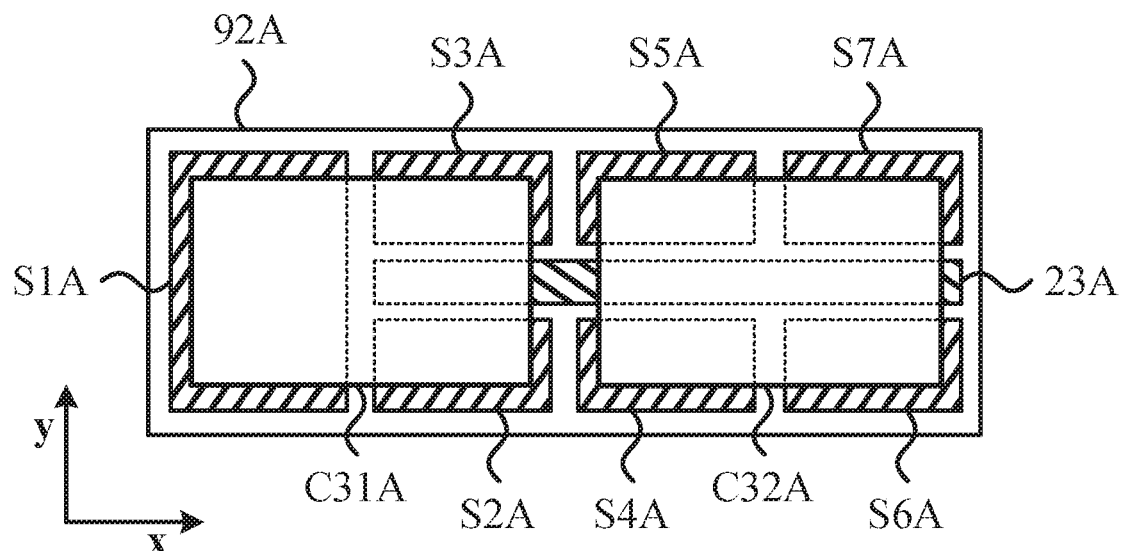
FIG. 10C is a close up of a switched capacitor unit from the partitioned power converter implementation illustrated in FIG. 10B.

As shown in the top view of FIG. 10C, switched capacitor unit 92A includes seven power switches S1A-S7A, two pump capacitors C31A-C31B, and a control/driver circuit 23A. The exact size of the active devices need not be the same size as the passive elements for the first loss-reduction technique to be effective. They simply need to be underneath the passive devices. This arrangement allows for more uniform current distribution and reduced wire length in the interconnect structure of the power converter.

Figure 10D:
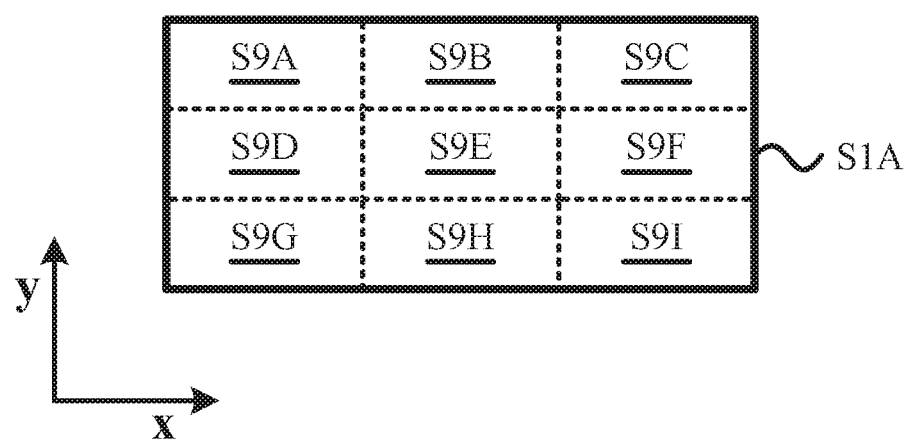
FIG. 10D is a close up of one switch from the switched capacitor unit illustrated in FIG. 10C.

Furthermore, within each switched capacitor unit 92A-92C, the power switches and pump capacitors can be divided up into smaller subunits. This allows for an additional reduction in lateral current flow. An example of the power switch S1A divided up into nine sub units S9A-S9I is illustrated in FIG. 10D.

Figure 9B:
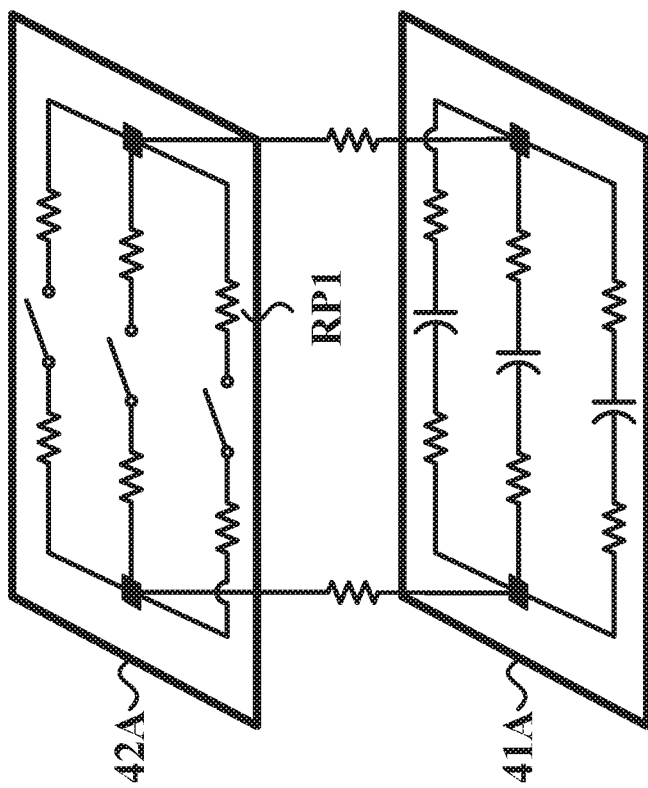
FIG. 9B shows a parasitic network between the active and passive layer with three nodes.

Since the single monolithic switched capacitor element 12A is divided up into numerous smaller switched capacitor units 92A-92C and placed so as to encourage current in only one direction as shown in FIG. 10B, the equivalent circuit becomes like that in FIG. 9B, thus reducing overall losses.

The technique is effective because the total capacitance increases when capacitors are placed in parallel. For example, this technique is far less effective with inductors because total inductance decreases when inductors are placed in parallel.

Another possible arrangement of the switched capacitor cells is shown in FIG. 11, in which the switched capacitor element is partitioned into small switched capacitor units 92A-92F along both the x and y direction. The exact size and dimensions of the switched capacitor units 92A-92F depend upon many characteristics such as metal thickness, capacitance density, step-down ratio, etc. Both of these techniques reduce the vertical and lateral distance between the switch devices and the passive devices while also providing a uniform current distribution to each individual switch and/or switched capacitor cell. Thus, the parasitic resistance and inductance of the connection between the switches and capacitors is minimized. This is important because the parasitic inductance limits the speed at which the converter can operate and hence its ultimate size while the parasitic resistance limits the efficiency of the power conversion process.

Among other advantages, the arrangements described above avoids the component and pin count penalty, reduces the energy loss in the parasitic interconnect structures and reduces the total solution footprint of power converters that use capacitors to transfer energy.

An apparatus as described herein finds numerous applications in the field of consumer electronics, particularly smart phones, tablet computers, and portable computers. In each of these cases, there are displays, including touch screen displays, as well as data processing elements and/or radio transceivers that consume power provided by the apparatus described herein.

Having described the invention, and a preferred embodiment thereof, what I claim as new, and secured by Letters Patent is:

1. An integrated circuit (IC) for use with a power converter, the IC comprising:
   a first layer comprising a first set of devices disposed on a device face thereof;
   a second layer comprising a second set of devices disposed on a device face thereof;
   a first interconnect structure to be disposed between the first layer and an electrical interface, the first interconnect structure to electrically couple the first set of devices to one or more thru vias; and
   a second interconnect structure to be disposed between the first layer and the second layer, the second interconnect structure to electrically couple the second set of devices to the one or more thru vias,
   wherein the one or more thru vias to extend through at least one of the following:
   the first layer; the second layer; or any combination thereof.

2. The IC of claim 1, wherein the first layer to comprise an active layer and the second layer to comprise a passive layer.

3. The IC of claim 2, wherein the first set of devices to comprise a set of active devices and the second set of devices to comprise a set of passive devices.

4. The IC of claim 1, wherein the first layer to comprise a passive layer and the second layer to comprise an active layer.

5. The IC of claim 4, wherein the first set of devices to comprise a set of passive devices and the second set of devices to comprise a set of active devices.

6. The IC of claim 1, wherein the device face of the first layer to face away from the device face of the second layer or to face the device face of the second layer.

7. The IC of claim 1, wherein the electrical interface to provide electrical conductivity between the power converter and a load.

8. The IC of claim 7, wherein the first and the second layer to form a stack of layers to be disposed on the electrical interface.

9. The IC of claim 8, wherein the stack of layers to vertically integrate the first set of devices with the second set of devices.

10. The IC of claim 1, wherein the first layer to be coupled to the electrical interface by one or more solder bumps disposed therebetween.

11. The IC of claim 1, and further comprising one or more additional layers having one or more sets of devices to be disposed on respective device faces of the one or more additional layers.

12. The IC of claim 11, wherein the one or more additional layers to comprise at least one passive layer comprising a passive set of devices to be disposed on a device face thereof.

13. The IC of claim 12, wherein the at least one passive layer to be disposed between the first layer and the second layer.

14. The IC of claim 12, wherein the at least one passive layer to be disposed between the electrical interface and one of the first layer or the second layer.

15. The IC of claim 1, wherein the first set of devices comprises a set of capacitors and the second set of devices comprises a set of switches.

16. The IC of claim 15, wherein the set of capacitors to be interconnected via the one or more thru vias to the set of switches to form a switch capacitor arrangement, a particular capacitor of the set of capacitors to be arranged in proximity to a particular switch of the set of switches so as to shorten a current path between the particular capacitor and the particular switch.

17. An apparatus comprising:
an electrical interface and a stack of layers disposed on the electrical interface, the stack of layers to include an active layer and a passive layer, the passive layer to be vertically integrated with the active layer, the active and the passive layers to include respective device faces and device-free faces opposite the device faces; and
a plurality of interconnections to electrically couple the active layer and the passive layer to one or more thru vias, the one or more thru vias to extend through the active and the passive layers,
wherein the plurality of interconnections to comprise a first interconnect structure to be disposed on the device face of the passive layer and a second interconnect structure to be disposed on the device face of the active layer, the device face of the active layer to face away from the device face of the passive layer, and
wherein the active and the passive layers to be wafer-bonded at the respective device-free faces.

18. The apparatus of claim 17, wherein the active layer to comprise a plurality of switches and the passive layer to comprise a plurality of capacitors to be interconnected via the one or more thru vias to the plurality of switches to form a switched capacitor circuit.

19. The apparatus of claim 18, wherein the plurality of switches and the plurality of capacitors to be arranged within the stack of layers so as to reduce a vertical and a lateral distance between the plurality of switches and the plurality of capacitors.

20. The apparatus of claim 19, wherein the arrangement to shorten a current path between the plurality of switches and the plurality of capacitors so as to reduce energy loss during operation of the switched capacitor circuit.

* * * * *